United States Patent [19]
Mishiro et al.

[11] Patent Number: 5,910,755
[45] Date of Patent: Jun. 8, 1999

[54] LAMINATE CIRCUIT BOARD WITH SELECTABLE CONNECTIONS BETWEEN WIRING LAYERS

[75] Inventors: Hidehiro Mishiro; Kenichiro Tsubone; Mitsunori Abe; Rie Takada, all of Kawasaki, Japan

[73] Assignee: Fujitsu Limited, Kawasaki, Japan

[21] Appl. No.: 08/959,711

[22] Filed: Oct. 28, 1997

Related U.S. Application Data

[62] Continuation of application No. 08/662,959, Jun. 13, 1996, abandoned, which is a continuation of application No. 08/331,506, filed as application No. PCT/JP94/00327, Feb. 28, 1994, abandoned.

[30] Foreign Application Priority Data

| Mar. 19, 1993 | [JP] | Japan | 5-060295 |
| Jun. 14, 1993 | [JP] | Japan | 5-141647 |

[51] Int. Cl.$^6$ .......................... H03H 7/075; H01G 4/255
[52] U.S. Cl. ...................... 333/24 C; 333/185; 361/278; 361/321.2
[58] Field of Search ................. 333/184, 185, 333/204, 205, 24 C; 361/761, 763, 328–330, 321.2, 321.3, 320, 299.4, 278

[56] References Cited

U.S. PATENT DOCUMENTS

| 4,904,967 | 2/1990 | Morri et al. | 333/185 |
| 5,039,965 | 8/1991 | Higgins, Jr. | 333/185 |
| 5,140,497 | 8/1992 | Kato et al. | 333/202 |
| 5,161,086 | 11/1992 | Howard et al. | 361/321 |
| 5,225,969 | 7/1993 | Takaya et al. | 333/185 |
| 5,278,526 | 1/1994 | Ikeda | 333/185 |
| 5,357,227 | 10/1994 | Tonegawa et al. | 333/204 |
| 5,374,909 | 12/1994 | Hirai et al. | 333/219 |
| 5,382,925 | 1/1995 | Hayashi et al. | 333/112 |
| 5,392,019 | 2/1995 | Ohkubo | 333/185 |
| 5,396,201 | 3/1995 | Ishizaki et al. | 333/219 |
| 5,404,118 | 4/1995 | Okamura et al. | 333/219 |
| 5,412,358 | 5/1995 | Hirai et al. | 333/204 |
| 5,497,130 | 3/1996 | Hirai et al. | 333/204 |

FOREIGN PATENT DOCUMENTS

| 59-83010 | 6/1984 | Japan . |
| 59-132611 | 7/1984 | Japan . |
| 59-132643 | 7/1984 | Japan . |
| 59-181501 | 10/1984 | Japan . |
| 1-313908 | 12/1989 | Japan . |
| 2-7483 | 2/1990 | Japan . |
| 2-215194 | 8/1990 | Japan . |
| 2-246299 | 10/1990 | Japan . |
| 4-58601 | 2/1992 | Japan . |
| 4-35886 | 6/1992 | Japan . |
| 4-93114 | 8/1992 | Japan . |
| 4-291803 | 10/1992 | Japan . |
| 5-218705 | 9/1993 | Japan | 333/204 |

Primary Examiner—Seungsook Ham
Attorney, Agent, or Firm—Armstrong, Westerman, Hattori, McLeland & Naughton

[57] ABSTRACT

A laminate capacitor circuit board which permits constants of various kinds of circuit elements to be set by selectively effected connections between wiring layers, and a laminate capacitor circuit board which permits distributed circuit constants in a high-frequency wiring layer sandwiched between two shielding wiring layers to be set as desired. These circuits are formed with at least a pattern of a conductive foil on each dielectric layer, and include a plurality of wiring layers laminated one upon another, a wiring layer for connections laminated to a surface of the plurality of wiring layers laminated one upon another, a plurality of terminal patterns formed on the wiring layer for connections in a state insulated from each other, a plurality of vias for electrically connecting at least two of the plurality of terminal patterns to corresponding ones of the plurality of wiring layers, and connecting means for selectively connecting the plurality of terminal patterns to each other.

5 Claims, 23 Drawing Sheets

PRIOR ART

PRIOR ART

LAMINATE CIRCUIT BOARD WITH SELECTABLE CONNECTIONS BETWEEN WIRING LAYERS

This application is a continuation of application Ser. No. 08/662,959 filed Jun. 13, 1996, now abandoned; which is a continuation of application Ser. No. 08/331,506 filed Oct. 20, 1994, now abandoned; which is a 371 of PCT/JP94/00327, filed Feb. 28. 1994.

BACKGROUND OF THE INVENTION

1. Field of the Invention

The present invention relates to a laminate circuit board comprising a plurality of laminated wiring layers and, more particularly, to a laminate circuit board which permits constants of various circuit elements contained therein to be set by selecting various combinations of connections between the wiring layers, and a laminate circuit board which permits distributed constants of a high-frequency wiring layer sandwiched between two shielding wiring layers to be set as desired.

2. Description of the Related Art

Conventionally, a laminate circuit board is formed by laminating a plurality of wiring layers formed with respective wiring patterns thereon, one upon another, and forming vias between the wiring layers when connections are required therebetween.

Such a laminate circuit board has been utilized not only as a mere laminate of substrates on which are arranged ordinary circuit elements and wirings connecting them, but also as one which forms a capacitor element, a resistance element, an inductance element, or the like, depending on the state of laminated layers.

FIG. 21 (A) and FIG. 21 (B) show the construction of a conventional laminate circuit board used as a capacitor element. FIG. 21 (A) is an exploded perspective view of the conventional laminate circuit board, while FIG. 21 (B) is a view showing same in its finished state. This capacitor element is a laminate capacitor 384 in which wiring layers 381 and 382 opposite in polarity are laminated in a plurality of pairs, one upon another. Bodies 381a and 382a of each pair of the wiring layers 381 and 382 are formed of dielectric material, and have surfaces thereof printed with electrode foils 381b and 382b, respectively.

The electrode foils 381b and 382b are printed such that they extend up to edges 381c and 382c which correspond to one ends of each of the bodies 381a and 382a of the wiring layers located on respective sides opposite each other. The wiring layers 381 and 382 are laminated in a required number of pairs, and then subjected to press and firing. On the laminate capacitor 384 formed by a press are mounted electrode terminals 384a and 384b on respective electrode take-out sides as shown in FIG. 21 (B), and the resulting laminate capacitor 384 is mounted on an electronic circuit as the capacitor element. The electrode terminals 384a and 384b are connected to the edges 381c and 382c, respectively.

In the laminate capacitor 384 constructed as above, the electrostatic capacity between wiring layers depends on the dielectric constant of dielectric material forming the bodies 381a and 382a and thickness thereof, and the areas of the electrode foils 381b and 382b. Further, it is possible to realize various values of a total electrostatic capacity of the laminate capacitor 384 by varying the number of laminated layers.

However, such a laminate capacitor 384 is required to take into consideration the number of wiring layers laminated, outer dimensions of same, etc. to meet a required value of electrostatic capacity, which results in a low manufacturing efficiency and poor manageability. Further, as the number of wiring layers laminated and the outer dimensions of same are changed, it is required to supply electrode terminals 384a and 384b having sizes corresponding thereto, this also degrades the manufacturing efficiency, etc.

Further, such a laminate circuit board constructed as a resistance element or as an inductance element other than one as the capacitor element described above also suffers from similar problems.

Further, when inductance element is formed by the laminate circuit board, constants of the inductance element are restricted by the material forming the bodies of wiring layers, which makes it impossible to obtain an inductance element having desired constants (especially, a constant of dielectric loss). If an LC filter, for example, is constructed by the use of such an inductance element, there arises a problem that a desired Q (quality factor) cannot be obtained.

On the other hand, a high-frequency circuit board using a strip line can be formed with patterns (of transmission lines) by IC technology and the like. Such a high-frequency circuit board is widely applied to portable telephones and the like because it is excellent in mass productivity, reproducibility, and economy, and small in size and weight.

The high-frequency circuit board of this kind is required to inhibit electric wave from leaking therefrom and prevent extraneous interferences from occurring thereto, as well as to facilitate adjustment of distributed constants thereof.

FIG. 22 shows a high-frequency circuit board of an open type using a typical micro strip line. This high-frequency circuit board comprises a dielectric substrate 401 formed of alumina ceramic, quartz, sapphire or the like, on one side of which is formed a strip line (conductor pattern) 402, and on the other side of which is formed a ground pattern (grounding conductor) 403.

Since the high-frequency circuit board is of an open type having the strip line 402 formed on the surface of the substrate, it is convenient for adjusting circuit characteristics, such as impedance, or for effecting maintenance. On the other hand, however, there arises problems of leakage of electric waves, extraneous interference, etc.

To solve these problems, a high-frequency circuit board (triplate strip line) of a laminate type has recently come into use, in which a central conductor (strip line) is shielded by grounding conductors arranged above and below the central conductor.

The high-frequency circuit board of this type is, as shown in FIG. 23, comprised of a strip line 404 as the central conductor, ground patterns 406a and 406b arranged on opposite sides thereof with dielectric layer (substrate) 405 interposed therebetween, and a surface wiring pattern 407a and a surface ground pattern 407b arranged on one surface thereof with the dielectric layer 405 provided thereunder.

The strip line 404 is electrically connected to the surface wring pattern 407a by way of a via 408a, while the ground patterns 406a and 406b are electrically connected to the surface ground pattern 407b by way of a via 408b.

The ground patterns 406a and 406b provided in pair are formed of plain flat foils, and the strip line 404 is shielded by the ground patterns 406a and 406b. Therefore, compared with the high-frequency circuit board of an open type described above, this high-frequency circuit board of a shielded type is markedly lower in leakage of electric wave and in extraneous interference.

However, in the conventional high-frequency circuit board of the shielded laminate type, a strip line and ground patterns are arranged in inner layers of the laminate circuit board, which brings about problems of difficulty in adjustment of circuit characteristics, such as impedance and matching of frequencies.

SUMMARY OF THE INVENTION

The present invention has been made in view of these circumstances, and a first object thereof is to provide a laminate circuit board which permits electrical connections between wiring layers to be effected as desired according to the purpose of the circuit element, to thereby obtain a circuit element set to different circuit constants, with the number of laminated layers and the outer dimensions of the laminate circuit board remaining identical.

Further, a second object of the invention is to provide a laminate circuit board of a shielded type which allows adjustment of circuit characteristics thereof, such as impedance and matching of frequencies, to be effected with ease.

To attain the first object, the present invention provides a laminate circuit board comprising a plurality of wiring layers each having a dielectric layer formed with at least a pattern of a conductive foil, the plurality of wiring layers being laminated one upon another, a wiring layer for connections laminated to a surface of the plurality of wiring layers laminated one upon another, a plurality of terminal patterns formed on the wiring layer for connections in a state insulated from each other, a plurality of vias for connecting at least two of the plurality of terminal patterns to corresponding patterns formed on the plurality of wiring layers, and connecting means for selectively connecting the plurality of terminal patterns to each other.

Further, the plurality of wiring layers are used as wiring layers for electrodes of a laminate-type capacitor, or as wiring layers for a resistance element of a laminate-type resistor, or further as wiring layers for an inductance element of a laminate-type coil. Further, the plurality of wiring layers are used as wiring layers for electrodes of a laminate-type capacitor, and wiring layers for an inductance element of a laminate-type coil, to form an LC filter and an impedance-matching circuit.

Next, to attain the second object, the invention provides a laminate circuit board including a high-frequency line, a pair of ground patterns opposed to each other with the high frequency line being interposed therebetween, the high-frequency line and the pair of ground patterns being arranged within dielectric, and a surface wiring pattern formed on a surface of the circuit board. This laminate circuit board comprises a plurality of foil pieces provided on at least one of the ground patterns, in a state separated from each other to be electrically insulated from each other, a plurality of lands provided on the surface wiring pattern in a state insulated from each other, and being connected to the plurality of foil pieces by way of vias, respectively, a surface ground pattern for grounding provided on the surface wiring pattern, and electrically-connecting means for electrically connecting selected ones of the plurality of lands to the surface ground pattern.

Alternatively, this laminate circuit board comprises a plurality of lands provided in the surface wiring pattern along the high-frequency line in a state insulated from each other, a surface signal pattern provided in the surface wiring pattern for taking out a signal, a plurality of vias for connecting the plurality of lands to the high-frequency line at corresponding locations, respectively, and electrically-connecting means for electrically connecting selected ones of the plurality of lands to the surface signal pattern.

BRIEF DESCRIPTION OF THE DRAWINGS

FIG. 21 (A) and FIG. 21(B) are diagrams showing the construction of a conventional laminate capacitor, in which FIG. 21 (A) is an exploded perspective view, and FIG. 21 (B) is a perspective view showing same in a finished state;

DETAILED DESCRIPTION OF THE PREFERRED EMBODIMENTS

Next, embodiments of the invention will be described with reference to the drawings.

Figure 1:
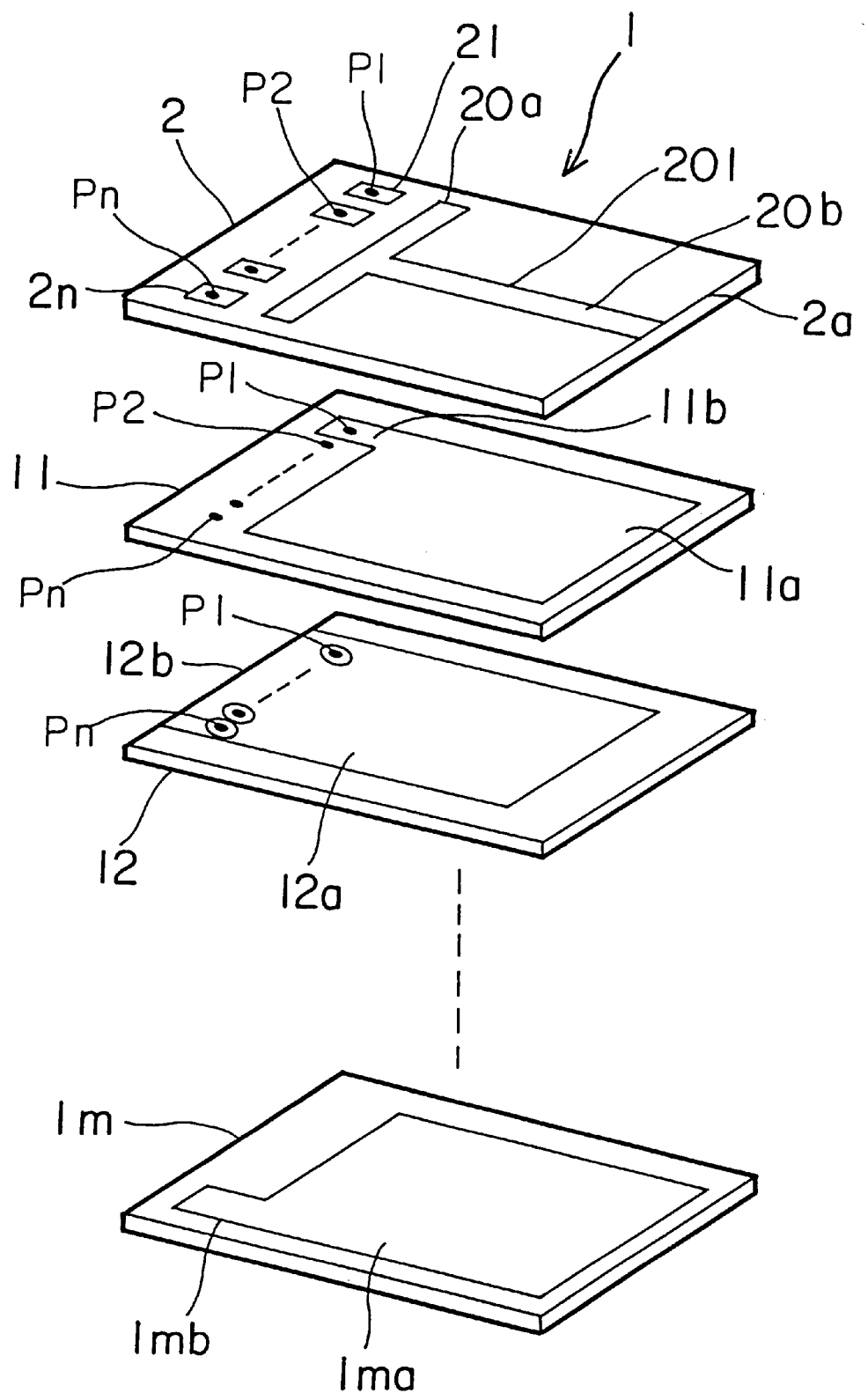
FIG. 1 is an exploded perspective view of a laminate capacitor according to a first embodiment of the invention.

FIG. 1 is an exploded perspective view showing the construction of a laminate capacitor according to a first embodiment of the invention. The laminate capacitor 1 is formed by laminating a plurality of electrode wiring layers 11 to 1m (m: an odd number) laminated to each other under a wiring layer 2 for connections provided on the uppermost location. Further, the electrode wiring layers 11 to 1m are laminated such that an odd number-th one from the top and an even number-th one from same are opposite in polarity. The electrode wiring layers 11 to 1m and the wiring layer 2 for connections each have a body of dielectric formed e.g. from a green sheet, with corresponding longitudinal and transverse dimensions of areas of the layers being substantially equal to each other.

Thus, one capacitor is formed by adjacent electrode wiring layers, e.g. by the electrode wiring layer 11 and the electrode wiring layer 12. Further, the electrode wiring layer 12 forms another capacitor together with an electrode wiring layer, not shown, positioned adjacent thereto on its lower side.

The electrode wiring layers except the electrode wiring layer 1m, and the wiring layer 2 for connections are each formed with holes of vias P1 to Pn. The number of holes of vias P1 to Pn is equal to the number of the odd number-th electrode wiring layers of the electrode wiring layers 11 to 1m, i.e. n=(m+1)/2. Further, these holes of vias P1 to Pn are charged with a via material, such as silver. The corresponding holes of vias formed through the different layers are arranged such that they are aligned when the layers are laminated to each other.

On the upper surface of the wiring layer 2 for connections, terminal foils 21 to 2n are printed, which are electrically connected to the vias P1 to Pn, respectively. Further, on the upper surface of the wiring layer 2 for connections, there is printed a connection passage 20 formed of a conductor in the shape of a character "T". The connection passage 20 has a passage 20a extending substantially parallel with a row of the vias P1 to Pn, and a passage 20b having one end thereof connected to a substantially central portion of the passage 20a. The other end of the passage 20b extends up to an edge 2a of the wiring layer 2 for connections.

On most part of an upper surface of the electrode wiring layer 11, there is printed an electrode foil 11a. The electrode foil 11a is formed with a terminal portion 11b, which is electrically connected to the via P1 alone. Similarly, the other odd numbered wiring layers are printed with electrode foils having respective terminal portions each connected to a corresponding one alone of vias subsequent to the via P2. The electrode foil 1ma on the lowermost electrode wiring layer 1m is connected to the via Pn by its terminal portion 1mb.

On the other hand, an electrode foil 12a is printed cover most part of an upper surface of the electrode wiring layer 12 as one of the even number-th electrode wiring layers. The printed foil 12a extends to an edge 12b of the electrode wiring layer 12. The electrode foil 12a is, however, formed with through holes at locations corresponding to the vias P1 to Pn for insulation therefrom. The other even number-th electrode wiring layers have respective similar constructions.

The laminate capacitor 1 is formed by positioning the wiring layer 2 for connections and the electrode wiring layers 11 to 1m, constructed as described above, to each other, and then laminating the layers to each other, followed by press and firing.

Figure 2:
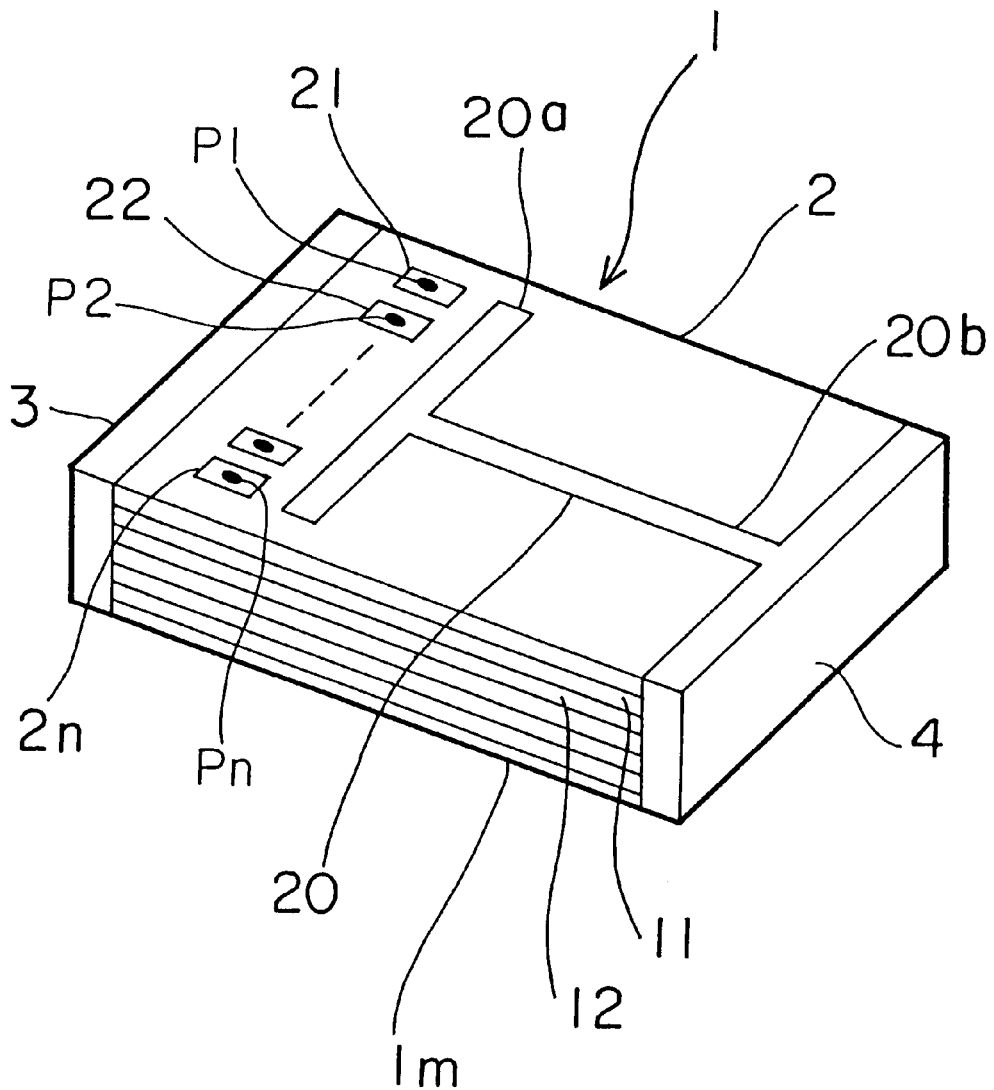
FIG. 2 is a perspective view showing an appearance of the laminate capacitor shown in FIG. 1.

FIG. 2 is a perspective view showing an appearance of the laminate capacitor 1 having been subjected to press. In the laminated state, the terminal foils 21 to 2n are electrically connected by way of the vias P1 to Pn to corresponding ones of the odd number-th electrode wiring layers of the electrode wiring layers 11 to 1m. Further, terminal members 3 and 4 are mounted on both the electrodes of the laminate capacitor 1.

The terminal member 3 is mounted such that it is electrically connected to the electrode foils 12a and so forth of the respective even number-th electrode wiring layers 12 and so forth. On the other hand, the terminal member 4 is mounted such that it is electrically connected to the passage 20b of the wiring layer 2 for connections.

The construction described above makes it possible to effect electrical connections between the terminal foils 21 to 2n and the passage 20a of the laminate capacitor 1 by printed wiring, wire bonding, or other processing, to thereby create a desired value of electrostatic capacity between the terminal members 3 and 4 in proportion to the number of the electrical connections effected.

Figure 3:
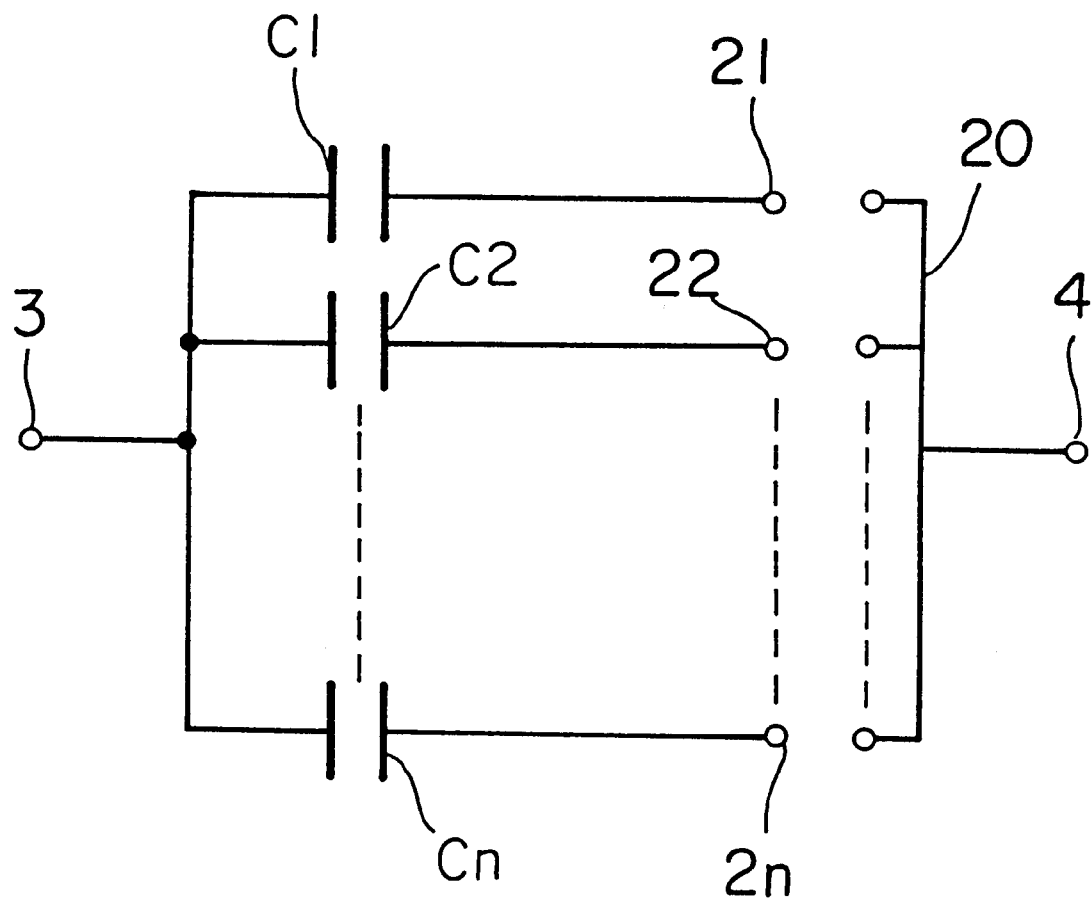
FIG. 3 is a circuit diagram for explaining the principle of adjusting the electrostatic capacity of the laminate capacitor.

FIG. 3 is a circuit diagram which is useful in explaining the principle of adjustment of the electrostatic capacity of the laminate capacitor 1 through connecting operations mentioned above. Within the laminate capacitor 1, a number n of capacitors C1 to Cn are formed by the odd numbered electrode wiring layers 11 and so forth and the even numbered electrode wiring layers 12 and so forth. These capacitors C1 to Cn form the laminate capacitor 1 as a whole through connections effected between at least one of the electrode foils 21 to 2n corresponding thereto, to the passage 20a.

If the terminal foil 21 is connected to the passage 20a, for example, the capacitor C1 formed by the electrode wiring layer 11 and the electrode wiring layer 12 is taken out as the laminate capacitor 1. Similarly, by connecting one of the other terminal foils 22 to 2n to the passage 20a, a corresponding one of the capacitors C2 to Cn is taken out as the laminate capacitor 1. The electrostatic capacity of capacitors 1 to Cn is determined by space intervals of the electrode wiring layers, dielectric constant, areas of electrodes, etc. These values may be identical among all the capacitors, whereby a plurality of terminal foils may be simultaneously connected to the passage 20a to form a synthesis electrostatic capacity as desired. Further, the capacitors 1 to Cn may have different values of electrostatic capacity.

Thus, the laminate capacitor 1 of the present embodiment permits the electrostatic capacity thereof to be set as desired by connecting properly selected one(s) of electrode foils 21 to 2n to the passage 20a. Therefore, the laminate capacitor, which is small and uniform in size, can have a desired value of the electrostatic capacity, which makes it possible to apply the present capacitor to various electronic circuits, in a manner similar to a variable capacitor.

Figure 4:
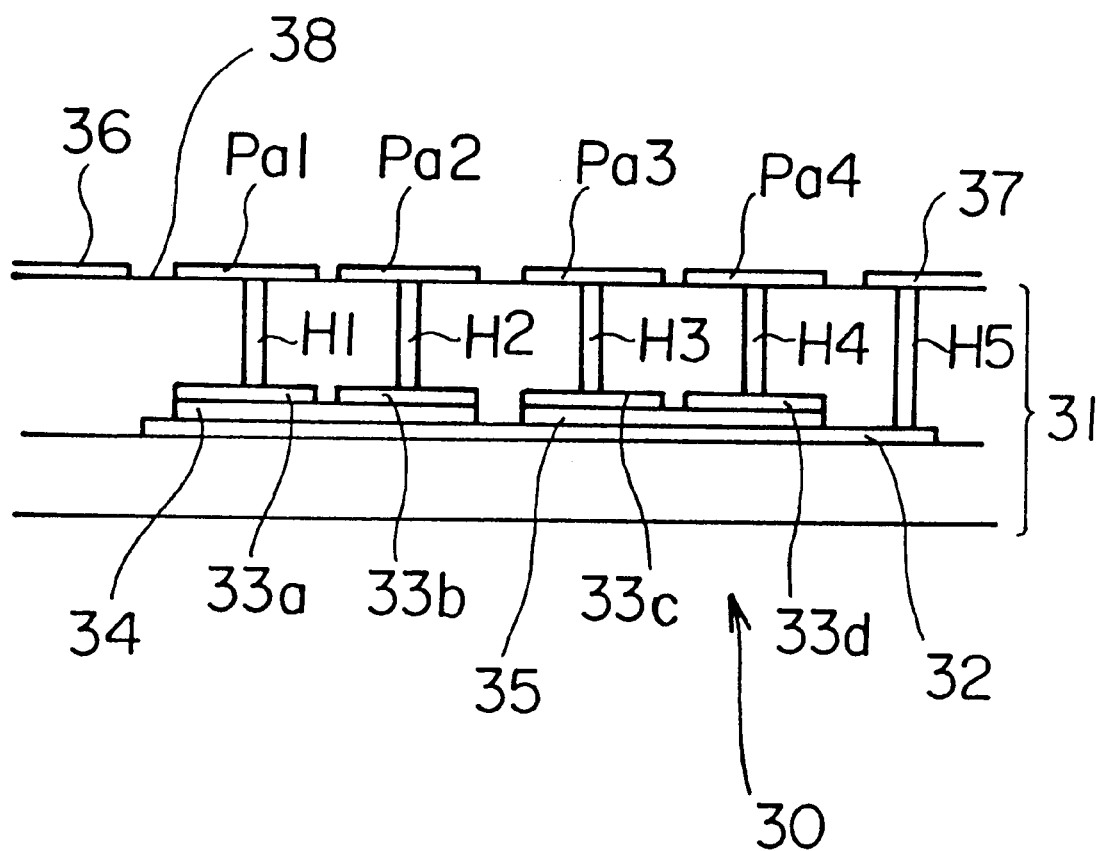
FIG. 4 is a sectional side elevation showing the construction of a second embodiment.

FIG. 4 shows a sectional side elevation showing the construction of a second embodiment of the invention. In this embodiment, another example of the laminate capacitor is described. A laminate capacitor 30 is comprised of a group of wiring layers 31 within which are formed capacitor layers. The capacitor layers are formed by a common electrode 32 formed as the lowermost layer, dielectrics 34 and 35 formed of two kinds of glass-series material as layers on top of the common electrode 32, and four split electrodes 33a to 33d and other split electrodes, not shown, formed on top of the layers 34 and 35. The split electrodes 33a and 33b are formed on the dielectric 34, while the split electrodes 33c and 33d on the dielectric 35.

A wiring layer 38 for connections is laminated on the uppermost layer of the wiring layer group 31. The wiring layer 38 for connections has a surface on which are printed terminal patterns 36 and 37, pad patterns Pa1 to Pa4, and other pad patterns, not shown. The pad patterns Pa1 to Pa4 are electrically connected to the split electrodes 33a to 33d by way of vias H1 to H4. Further, the terminal pattern 37 is electrically connected to the common electrode 32 by way of a via H5.

Figure 5:
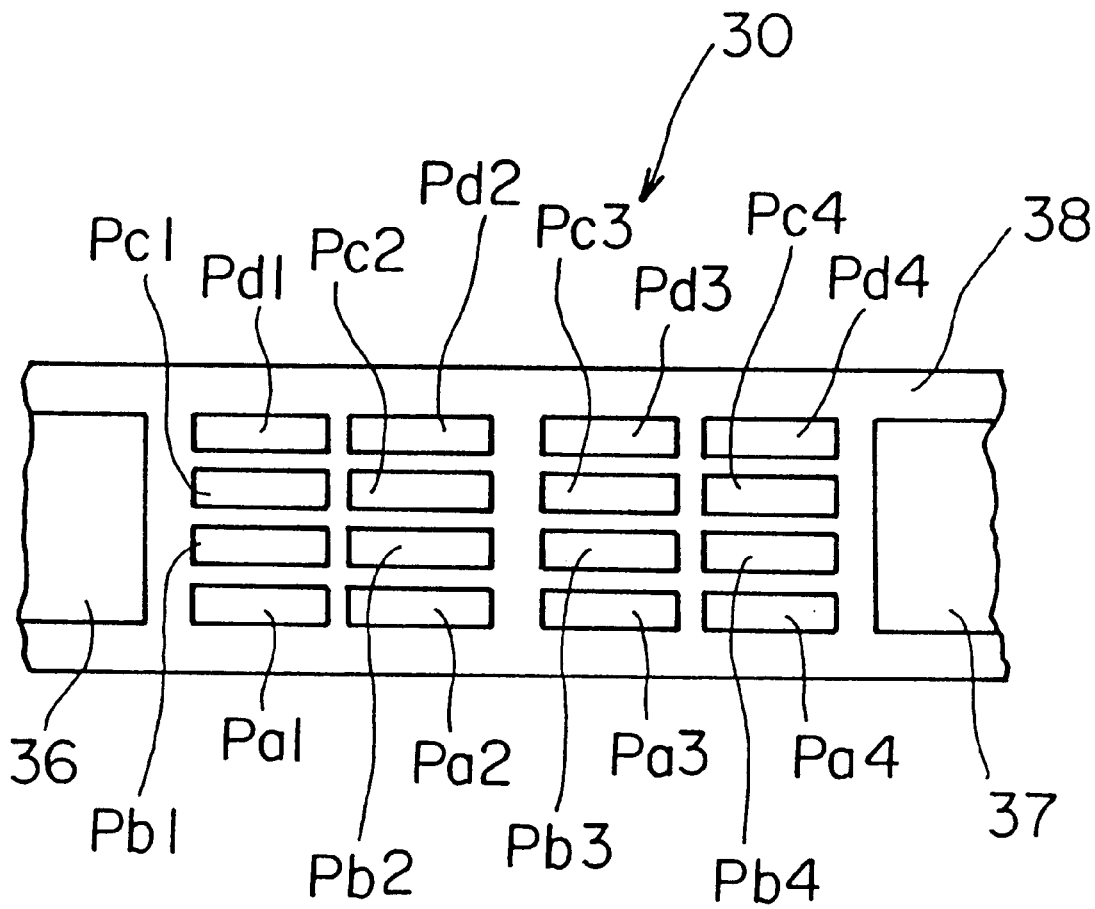
FIG. 5 is a plan view showing a laminate capacitor shown in FIG. 4.

FIG. 5 is a plan view of the laminate capacitor 30 shown in FIG. 4. As shown in the figure, the wiring layer 38 for connections has the surface on which are printed the terminal patterns 36 and 37, the pad patterns Pa1 to Pa4, and pad patterns Pb1 to Pb4, Pc1 to Pc4, and Pd1 to Pd4.

In the laminate capacitor 30 having the above-described construction, if the pad pattern Pa1 is connected to the terminal pattern 36, one capacitor is formed between the terminal patterns 36 and 37. Similarly, by selecting a desired number of pad patterns from the pad patterns Pa2 to Pa4, Pb1 to Pb4, Pc1 to Pc4, and Pd1 to Pd4, and then connecting them to the terminal pattern 36, or effecting connections between the pad patterns, a capacitor dependent on the number of selected pad patterns can be obtained. That is, it is possible to variably adjust the electrostatic capacity of a capacitor formed between the terminal patterns 36 and 37 in a manner dependent on a selected combination of connections.

Further, it is possible to form a laminate capacitor having a desired value of electrostatic capacity by properly selecting materials and thickness of the dielectrics 34 and 35, areas of electrodes, etc., in advance.

The connections between pad patterns and terminal patterns can be effected by wire bonding, pattern printing, mounting of jumper chips, etc.

Figure 6:
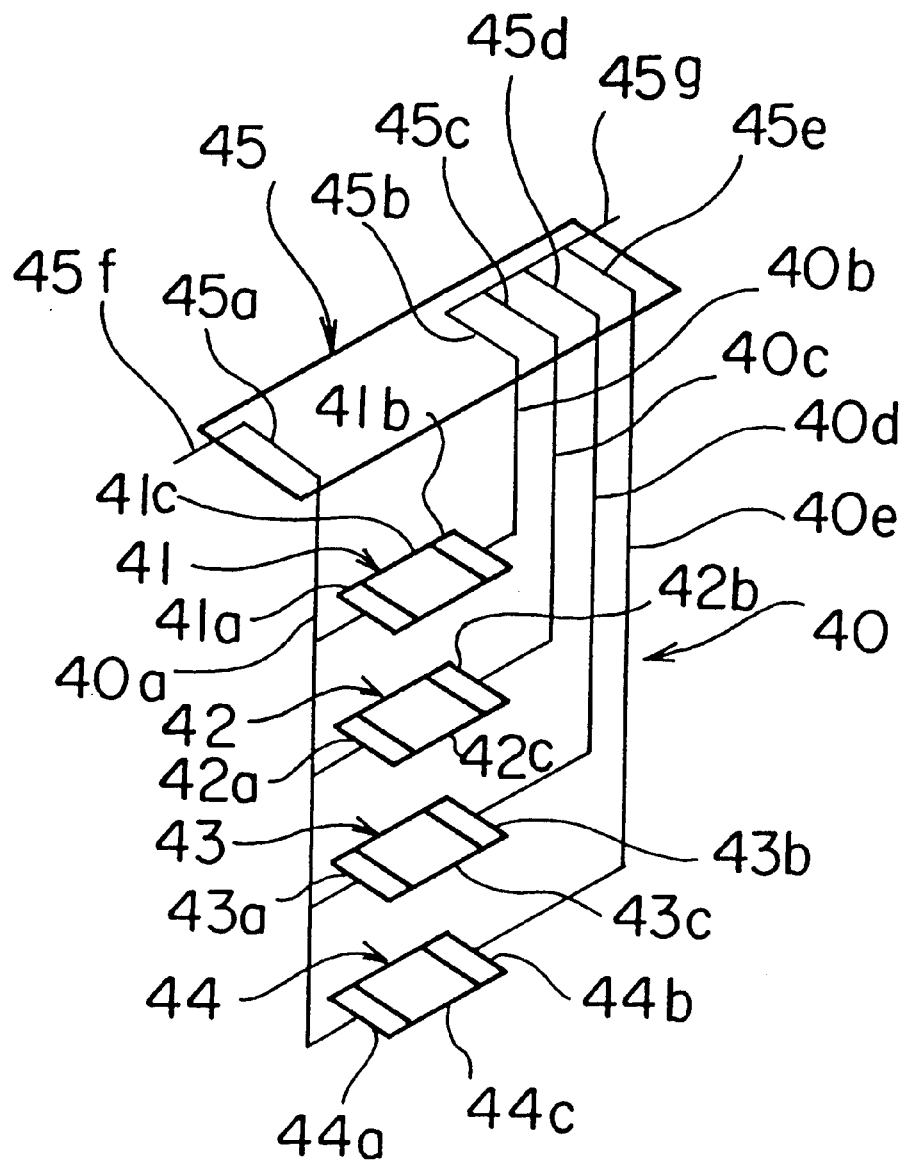
FIG. 6 is a diagram showing the concept of construction of a third embodiment.

FIG. 6 shows a diagram showing the concept of construction of a third embodiment of the invention. This embodiment shows an example of a case where the present invention is applied to a laminate resistor. A laminate resistor 40 is comprised, for example, of four layers of resistors 41 to 44, and a wiring layer 45 for connections as the uppermost layer. The resistor 41 is formed by first printing conductive patterns 41a and 41b on an insulator layer, and further printing a resistor pattern 41c formed of ruthenium oxide or the like on same. The conductive pattern 41a is connected to a surface pattern 45a of the wiring layer 45 for connections by way of a via 40a. On the other hand, the conductive pattern 41b is connected to a surface pattern 45b of the wiring layer 45 for connections by way of a via 40b.

The other resistors 42 to 44 are also formed by respective combinations of resistor patterns 42c to 44c, conductive patterns 42a to 44a, and conductive patterns 42b to 44b.

Further, the conductive patterns 42a to 44a are all connected by way of the via 40a to the surface pattern 45a of the wiring layer 45 for connections, whereas the conductive patterns 42b to 44b are connected by way of vias 40c to 40e to surface patterns 45c to 45e of the wiring layer 45 for connections, respectively.

It is assumed, here, that the resistor patterns 41c to 44c all have the same resistance value.

On the wiring layer 45 for connections, the surface pattern 45a is connected to a terminal 45f, whereas the surface patterns 45b to 45e are all connected to a terminal 45g.

According to this construction, a value of resistance offered between the terminals 45f and 45g of the laminate resistor 40 is a combined resistance of the resistors 41 to 44 obtained when they are all connected in parallel. Assuming that each resistance value of resistors 41 to 44 is r, a combined resistance value of the laminate resistor 40 is r/4.

Therefore, it is possible to increase the combined resistance value to the desired degree by cutting off some of the surface patterns 45b to 45e. Further, if the resistors 41 to 44 are designed to have respective values of resistance different from each other, it is possible to provide a wider variety of combinations.

Figure 7:
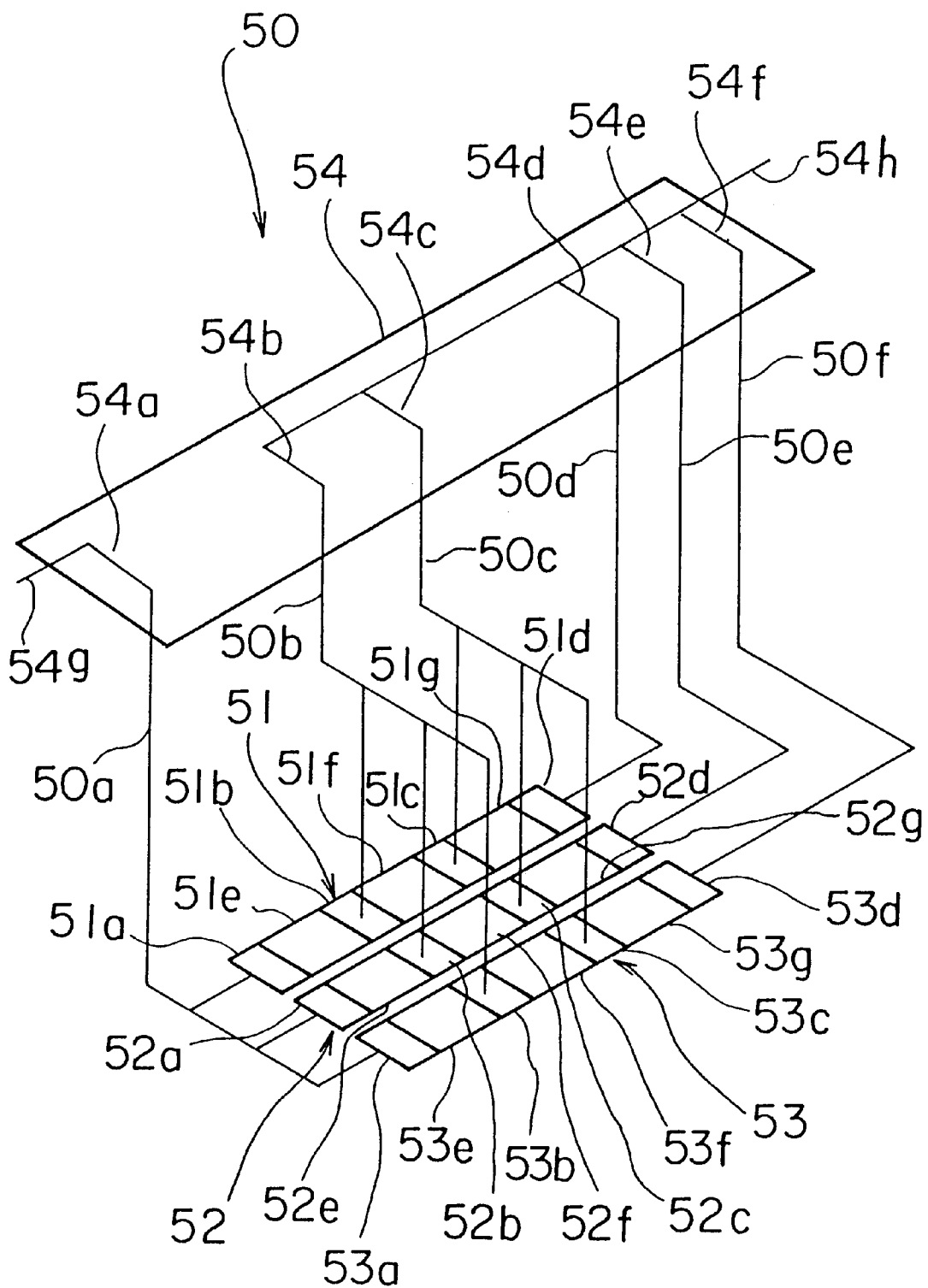
FIG. 7 is a diagram showing the concept of construction of a fourth embodiment.

FIG. 7 is a diagram showing the concept of a fourth embodiment as a variation from the third embodiment. A resistor 50 is comprised of three sheets of resistors 51 to 53 formed on the same layer, and a wiring layer 54 for connections laminated to the top of the resistors. On the resistor 51, conductive patterns 51a to 51d, and resistor patterns 51e to 51g are printed in an alternating manner and in series. Similarly, conductive patterns 52a to 52d and resistor patterns 52e to 52g are printed on the resistor 52, and conductive patterns 53a to 53d and resistor patterns 53e to 53g on the resistor 53.

Further, the resistors 51 to 53 have the conductive patterns 51a, 52a, and 53a at one ends thereof all connected by way of a via 50a to a surface pattern 54a of the wiring layer 54 for connections. On the other hand, the conductive patterns 51d, 52d, and 53d of the other ends of the resistors 51 to 53 are connected by way of vias 50d to 50f to the surface patterns 54d to 54f of the wiring layer 54 for connections.

Further, of the conductive patterns printed between the resistor patterns of the resistors 51 to 53, the conductive patterns 51b, 52b, and 53b located parallel with each other are connected by way of a via 50b to a surface pattern 54b of the wiring layer 54 for connections. Similarly, the conductive patterns 51c, 52c, and 53c located parallel with each other are connected by way of a via 50c to a surface pattern 54c of the wiring layer 54 for connections.

On the wiring layer 54 for connections, the surface pattern 54a is connected to a terminal 54g, while the surface patterns 54b to 54f are all connected to a terminal 54h.

According to this construction, it is possible to obtain the laminate resistor 50 having a desired value of resistance offered between the terminals 54g and 54h, by selectively cutting off the surface patterns 54b to 54f. For example, when all the surface patterns 54c to 54f other than the surface pattern 54b are cut off, the laminate resistor is formed by the resistors 51e, 52e and 53e connected in parallel with each other, which makes it possible to obtain the lowest resistance value. On the other hand, if all the surface patterns 54b to 54f except one of the surface patterns 54d to 54f are cut off, there can be obtained a laminate resistor having the highest resistance value.

In addition to the examples described above, it is possible to obtain a wide variety of resistance values from various combinations of cutoffs of the surface patterns 54b to 54f. Further, if the resistors are designed to have different resistance values from each other, it is possible to obtain an even wider variety of combinations.

Figure 8:
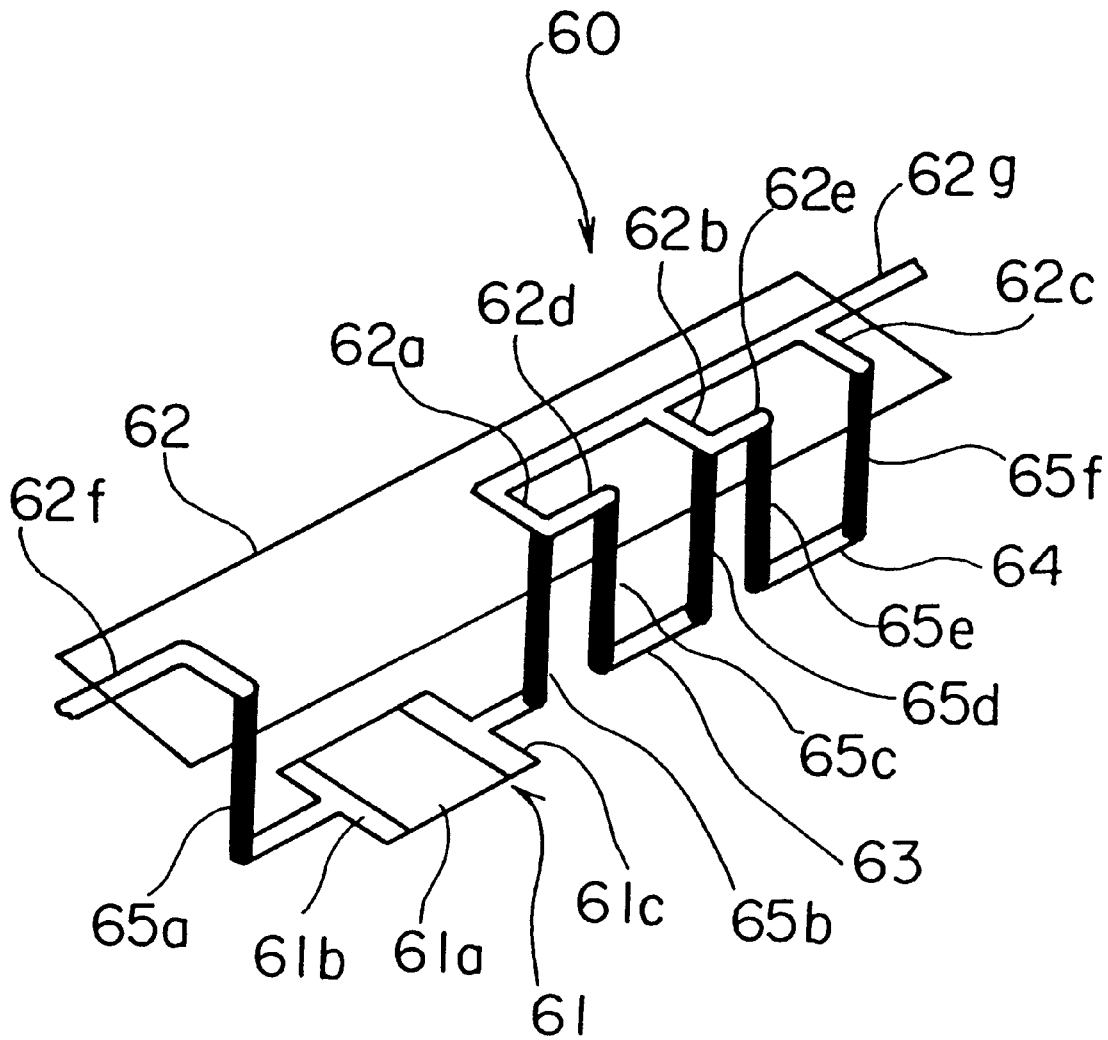
FIG. 8 is a diagram showing the concept of construction of a fifth embodiment.

FIG. 8 is a diagram showing the concept of construction of a fifth embodiment of the invention. A laminate resistor 60 is comprised of a resistor 61 and conductive patterns 63 and 64 formed on the same layer, and a wiring layer 62 for connections laminated on top of them. The resistor 61 is formed by printing resistor patterns 61a, and conductive patterns 61b and 61c. The resistor pattern 61a is comprised of ruthenium oxide or the like. On the other hand, the conductive patterns 61b and 61c are formed of an ordinary conductive material, such as copper or silver-palladium.

The conductive pattern 61b is connected to a terminal pattern 62f by way of a via 65a. On the other hand, the conductive pattern 61c is electrically connected to a terminal pattern 62g by way of a via 65b. In this connections, the terminal pattern 62g is formed with three branch terminal patterns 62a, 62b, and 62c, the via 65b being connected by way of the branch terminal pattern 62a to the terminal pattern 62g.

Both ends of the conductive pattern 63 are electrically connected to a via 65c and a via 65d. Further, both ends of the conductive pattern 64 are electrically connected to vias 65e and 65f. The via 65c is connected via a surface pattern 62d to the via 65b. The via 65d is connected by way of the branch terminal pattern 62b to the terminal pattern 62g, and at the same time by way of the surface pattern 62e to the via 65e. Further, the via 65f is connected via the branch terminal pattern 62c to the terminal pattern 62g.

By the way, for a conducting material to be charged in the vias 65a to 65f, the material of the same kind as that of the resistor pattern 61a is used. However, the vias 65a to 65f each have a cross-sectional area fairly larger than that of the resistor pattern 61a, so that they exhibit a resistance value fairly smaller than that of the resistor pattern 61a.

The laminate resistor 60 constructed as such, if in the state of wiring shown in FIG. 8, has a value of resistance offered between the terminal patterns 62f and 62g which is equal to a value of combined resistance of the resistor pattern 61a, the via 65a, and the via 65b, connected in series. That is, assuming that the value of resistance of the resistor pattern 61a is represented by R, and a value of resistance of each of the vias 65a to 65f is represented by r, the value of resistance offered between the terminal patterns 62f and 62g is equal to approximately R+2r.

In this state, if the branch terminal pattern 62a is cut off, the value of resistance between the terminal patterns 62f and 62g becomes equal to approximately R+4r by the addition of resistance values of the vias 65c and 65d. Further, if the branch terminal pattern 62b is cut off, the value of resistance between the terminal patterns 62f and 62g becomes equal to approximately R+6r.

In this manner, the resistance value of laminate resistor 60 can be increased by a very small incremental value (several %) on the basis of a value of resistance of the resistor pattern 61a, by selectively cutting off the branch terminal pattern 62a, and the branch terminal pattern 62b.

In addition, although in the present embodiment, there is provided a two-stage resistance value adjustment function by the use of the branch terminal patterns 62a and 62b, this is not limitative, but the resistance value adjustment function can be set to many more stages, if required.

Further, although in the present embodiment, the resistance value is adjusted by cutting off the branch terminal pattern 62a and the branch terminal pattern 62b, this is not limitative, but these patterns may be printed in a disconnected state in advance, and if adjustment of resistance values is required, connections may be effected, inversely to the above, by wire bonding or the like.

Figure 9:
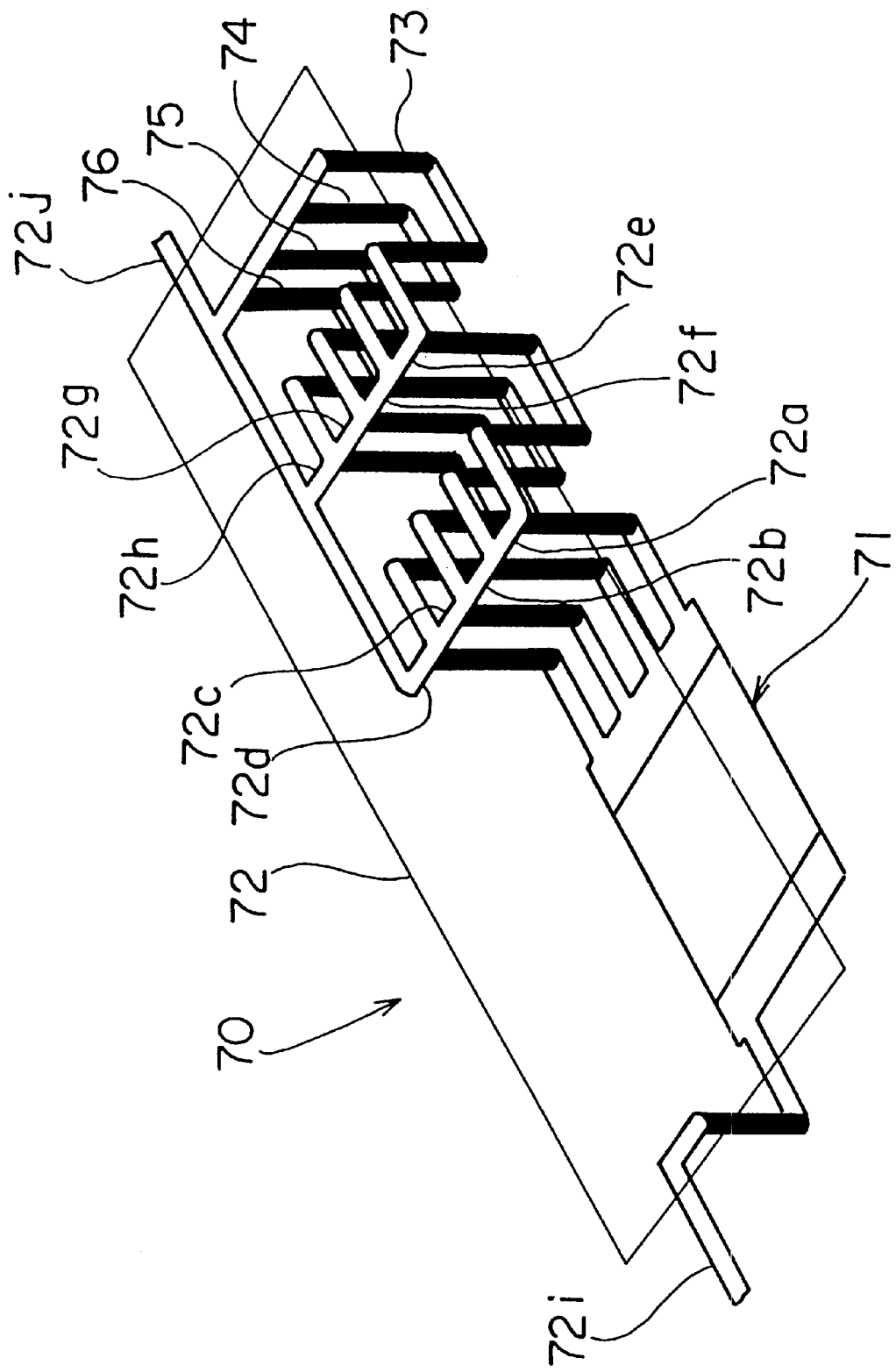
FIG. 9 is a diagram showing the concept of construction of a sixth embodiment.

FIG. 9 is a diagram showing a sixth embodiment as a variation from the fifth embodiment. A laminate resistor 70 is comprised of a resistor 71 having substantially the same construction as the resistor 61 shown in FIG. 8, and an array of a plurality of resistance paths 73 to 76 provided in parallel with each other. Each of the resistance paths 73 to 76 has substantially the same arrangement of component parts as that of component parts connected between the via 65b to 65f as shown in FIG. 8. Further, the pattern on a surface of the wiring layer 72 for connections includes branch terminal patterns 72a to 72h printed in parallel with a terminal pattern 72j according to the array of the resistance paths 73 to 76, as well.

This construction permits the laminate resistor 70 to be formed with various resistance paths by selectively cutting off one or more of the branch terminal patterns 72a to 72h. This makes it possible to variably adjust the value of resistance offered between the terminal patterns 72i and 72j.

Then, there will be described an embodiment in which the laminate circuit board of the invention is applied to an inductance element.

Figure 10:
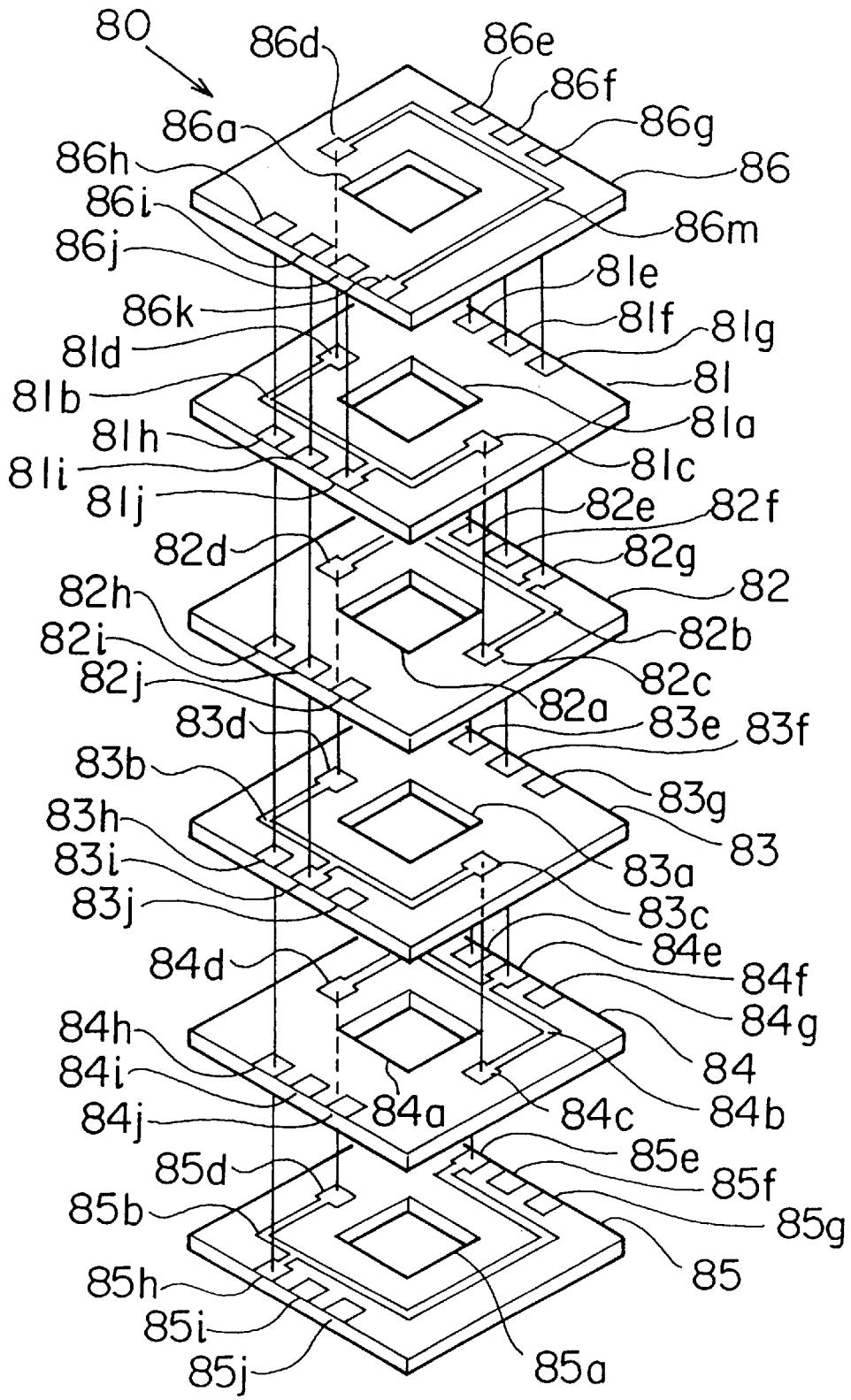
FIG. 10 is an exploded perspective view showing the construction of a laminate coil according to a seventh embodiment.

FIG. 10 is an exploded perspective view of a laminate coil according to a seventh embodiment of the invention. A laminate coil 80 is comprised, e.g. of five layers of wiring layers 81 to 85, and a wiring layer 86 for connections as the uppermost layer. The wiring layers 81 to 85 are each formed from green sheets having holes 81a to 85a formed through respective central portions at corresponding locations. On the wiring layers 81 to 85, coil members 81b to 85b are arranged such that they surround these holes 81a to 85a. The coil members 81b to 85b form segments for generating inductance of the laminate coil 80, and are formed by printing conductive foils. Shapes of the coil members 81b to 85b are substantially identical between ones on the odd number-th layers and between ones on the even number-th layers. The coil member 81b has both ends thereof formed with coil member terminals 81c and 81d. Similarly, the coil member 82b has both ends thereof formed with coil member terminals 82c and 82d, the coil member 83b with coil member terminals 83c and 83d, and the coil member 84b with coil member terminals 84c and 84d. The coil member 85b has, however, one end thereof formed with a coil member terminal 85d, and the other end thereof connected to a terminal foil 85e, referred to hereinafter.

Further, the wiring layer 81 has peripheral portions thereof printed with six terminal foils 81e to 81j. Similarly, the wiring layer 82 has peripheral portions thereof printed with terminal foils 82e to 82j at locations correspondent to the terminal foils 81e to 81j of the wiring layer 81, the wiring layer 83 with terminal foils 83e to 83j, the wiring layer 84 with terminal foils 84e to 84j, and the wiring layer 85 with terminal foils 85e to 85j. Then, on the wiring layer 81, the terminal foil 81j is connected to the coil member 81b, the terminal foil 82g to the coil member 82b on the wiring layer 82, the terminal foil 83i to the coil member 83b on the wiring layer 83, the terminal foil 84f to the coil member 84b on the wiring layer 84, and the terminal foil 85h to the coil member 85b on the wiring layer 85.

The wiring layer 86 for connections also has a hole 86a formed through a central portion thereof at a location corresponding to the holes 81a to 85a of the wiring layers 81 to 85, and terminal foils 86e to 86j formed at locations corresponding to the each six terminal foils of the wiring layers 81 to 85. Further, the wiring layer 86 for connections is formed with a terminal foil 86d at a location corresponding to the coil member terminal 81d of the wiring layer 81, and with a terminal foil 86k at a location adjacent to the terminal foil 86j. Further, a connection foil 86m is provided for connecting between the terminal foil 86d and the terminal foil 86k.

The wiring layer 86 for connections is formed with vias at locations corresponding to those of terminal foils 86d to 86j. The wiring layer 81 is formed with vias at locations corresponding to those of the coil member terminal 81c and the terminal foils 81e to 81i. The wiring layer 82 is formed with vias at locations corresponding to those of the coil member terminal 82d and the terminal foils 82e, 82f, 82h, and 82i. The wiring layer 83 is formed with vias at locations corresponding to those of the coil member terminal 83c and the terminal foils 83e, 83f, and 83h. The wiring layer 84 is formed with vias at locations corresponding to those of the coil member terminal 84d and the terminal foils 84e and 84h.

Therefore, when the wiring layer 86 for connections and the wiring layers 81 to 85 are laminated to each other in respective predetermined corresponding positions, and subjected to press and firing, the terminal foil 86d of the wiring layer 86 for connections is connected to the coil member terminal 81d of the wiring layer 81, the coil member terminal 82d of the wiring layer 82 to the coil member terminal 83d of the wiring layer 83, and the coil member terminal 84d of the wiring layer 84 to the coil member terminal 85d of the wiring layer 85. Further, the coil member terminal 81c of the wiring layer 81 is connected to the coil member terminal 82c of the wiring layer 82, and the coil member terminal 83c of the wiring layer 83 to the coil member terminal 84c of the wiring layer 84. As a result, there is formed a coil extending from the terminal foil 86k of the wiring layer 86 for connections, via the connection foil 86m, the coil member 81b of the wiring layer 81, the coil member 82b of the wiring layer 82, the coil member 83b of the wiring member 83, the coil member 84b of the wiring layer 84, the coil member 88b of the wiring layer 85, to the terminal foil 85e. The axis of the coil thus formed extends through the holes 81a to 86a.

Further, after firing, the electrode foil 86e of the wiring layer 86 for connections is connected to the terminal foil 85e of the wiring layer 85. Similarly, the terminal foil 86f of the wiring layer 86 for connections is connected to the electrode foil 84f of the wiring layer 84, the terminal foil 86g of the wiring layer 86 for connections to the terminal foil 82g of the wiring layer 82, the terminal foil 86h of the wiring layer 86 for connections to the terminal foil 85h of the wiring layer 85, the terminal foil 86i of the wiring layer 86 for connections to the terminal foil 83i of the wiring layer 83, and the terminal foil 86j of the wiring layer 86 for connections to the terminal foil 81j of the wiring layer 81. Therefore, the maximum inductance is created between the terminal foil 86k and the terminal foil 86e of the wiring layer 86 for connections, and the terminal foils 86j, 86g, 86i, 86f, and 86h of the wiring layer 86 for connections serve as tap terminals.

That is, a different value of inductance can be taken out by effecting, in the wiring layer 86 for connections, one connection to the terminal foil 86k, and the other connection to any of the foil terminals 86j, 86g, 86i, 86f, 86h, and 86e.

Further, when if material forming the green sheet, such as glass ceramics and alumina, is laminated inside the coil, the dielectric loss of the coil is increased, so that when an LC circuit is formed by the use of this coil, Q of the resulting LC circuit becomes small. To avoid such an inconvenience, in the present embodiment, the holes 81a to 86a are provided, with the axis of the coil extending therethrough.

The laminate coil 80 constructed as above makes it possible to obtain a coil which permits a desired value of inductance to be created, with the outer dimensions of the coil remaining unchanged, and at the same time lessens dielectric loss.

Figure 11:
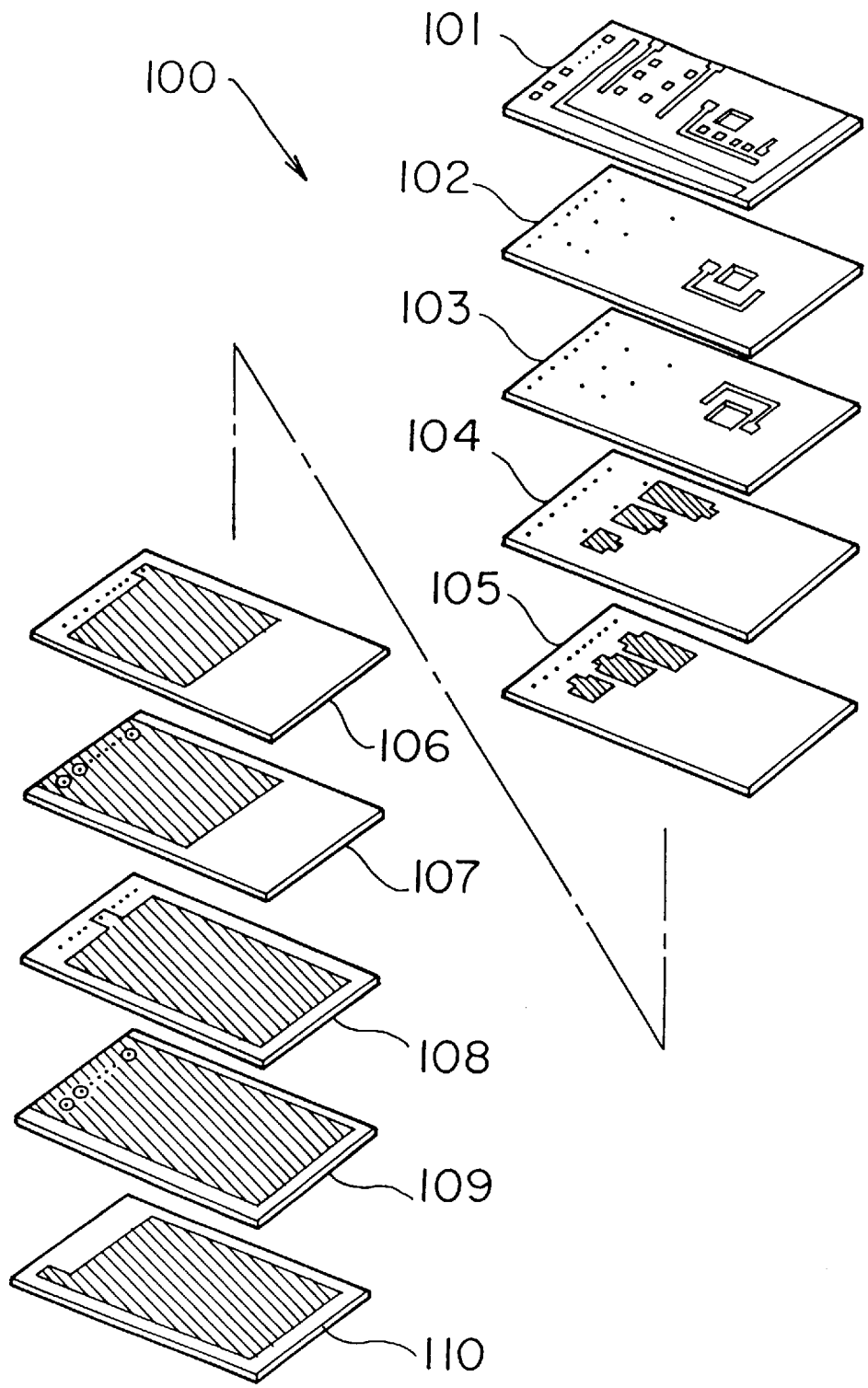
FIG. 11 is an exploded perspective view showing the construction of an impedance-matching circuit and LC filter according to an eighth embodiment.

FIG. 11 is an exploded perspective view of a laminate circuit board according to an eighth embodiment of the invention. This laminate circuit board is a circuit board to which the laminate capacitor shown in FIG. 1 and the laminate coil shown in FIG. 10 are applied, through perception of the fact that constants of the laminate capacitor shown in FIG. 1 and constants of the laminate coil shown FIG. 10 can be set as desired, thereby realizing an impedance-matching circuit and LC filter.

A laminate circuit board 100 of this embodiment is comprised of a wiring layer 101 for connections located on the surface of laminate, two wiring layers 102 and 103 forming an inductance element, and seven wiring layers 104 to 110 forming a capacitor element. These wiring layers 101 to 110 are connected to predetermined terminal foils on the wiring layer 101 for connections by way of respective vias, as shown in FIG. 1 and FIG. 10.

Figure 12:
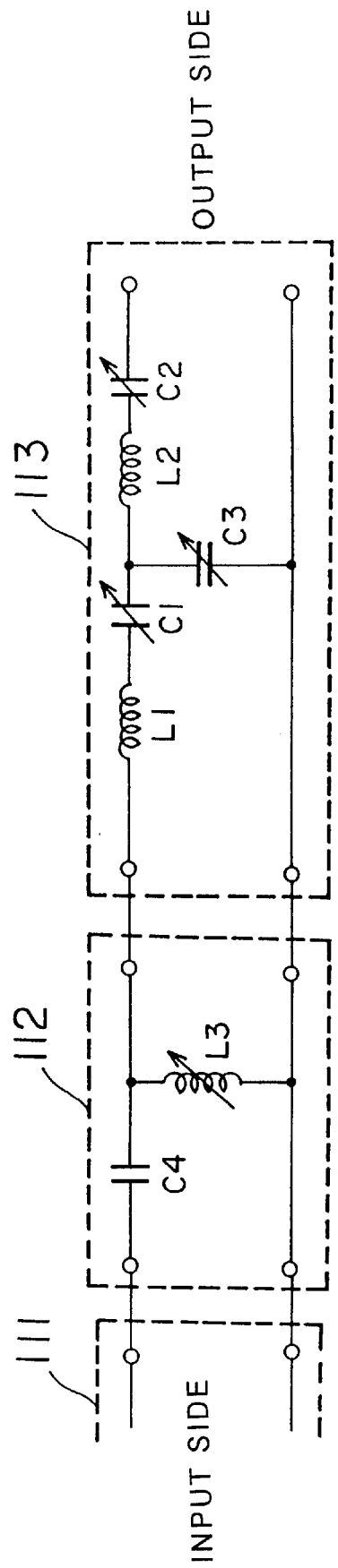
FIG. 12 is a circuit diagram of the eighth embodiment shown in FIG. 11.

FIG. 12 is a circuit diagram showing the impedance-matching circuit and LC filter thus formed. More specifically, FIG. 12 shows an impedance-matching circuit 112 and an LC filter 113 connected to a 50 _& 8_ terminal circuit 111 of a mobile communication system. The LC filter 113, which is adapted to adjust an output center frequency or a band width, is comprised of coils L1 and L2 having respective fixed values of inductance, and capacitors C1, C2, and C3 which are variable in capacity. The capacitors C1 and C2 are formed by the wiring layers 104 and 105 appearing in FIG. 11, while the capacitor C3 is formed by the wiring layers 106 to 110 appearing in same. The values of capacity of these capacitors are set by connections effected for terminals foils on the wiring layer 101 for connections. The impedance-matching circuit 112, which is adapted to effect matching of impedance with the output side, is comprised of a capacitor C4 having a fixed capacity, and a coil L3 with a variable inductance. The coil L3 is formed by the wiring layers 102 and 103 appearing in FIG. 11. The values of inductance of these coils are set by connections effected for terminal foils on the wiring layer 101 for connections. In this connection, although the coils L1 and L2 having the fixed values of inductance, and the capacitor C4 having the fixed value of capacity are externally attached to the wiring layer 101 for connections in this embodiment, this is not limitative, but they may be provided in the wiring layers 101 to 110.

More specifically, an area of the laminate circuit board is set to 1 to 2 cm$^2$, and the wiring layers 104 to 110 for capacitors C1, C2, and C3 are provided in 2 to 10 layers, with the coil L3 having 3 to 10 taps provided therefor. If the impedance of the LC filter 113 is equal to 3.5 KΩ, for example, after the LC filter 113 is adjusted, the capacity of the capacitor C4 of the impedance-matching circuit 112 is set to approximately 80 pF, and the inductance of the coil L3 to approximately 15 μH, to effect matching with the impedance 50 Ω of the input side.

Figure 13:
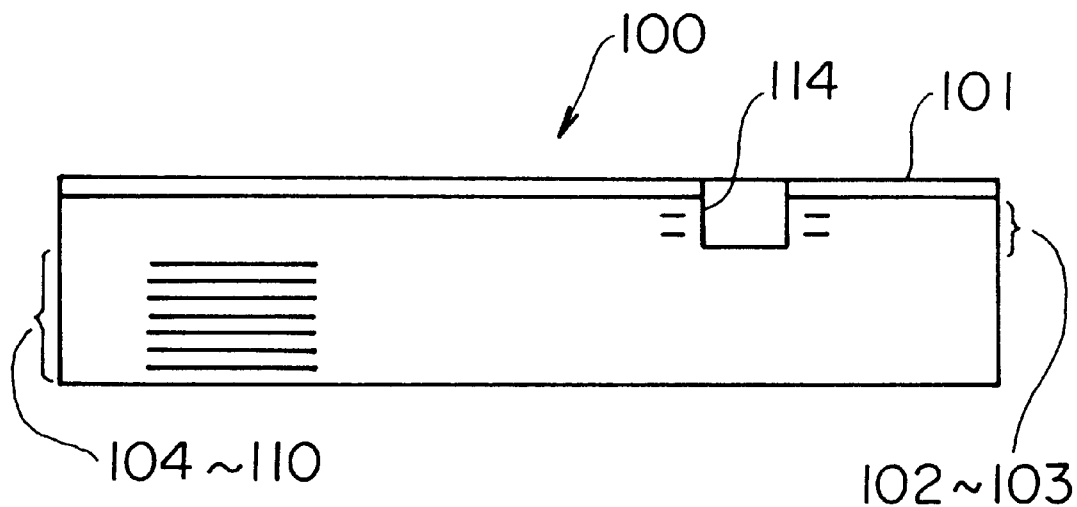
FIG. 13 (A) and FIG. 13 (B) are sectional side elevations of laminate circuit boards, in which FIG. 13 (A) is a sectional side elevation of the eighth embodiment shown in FIG. 11, while FIG. 13 (B) is a sectional side elevation of a laminate circuit board of another type.
Figure 13:
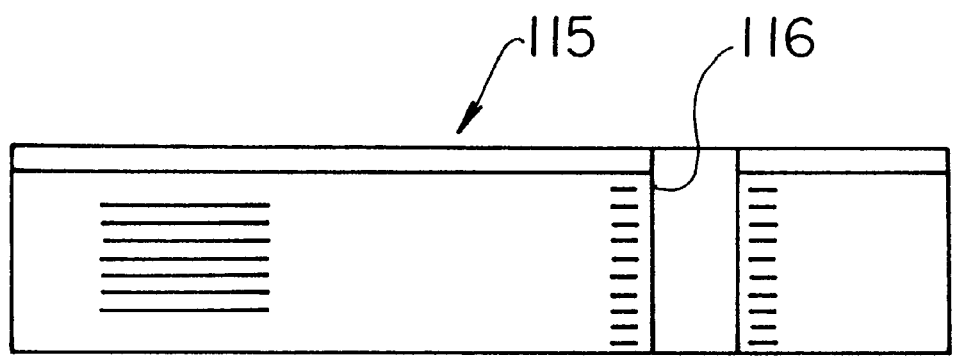

FIG. 13 (A) and FIG. 13 (B) are sectional side elevations of laminate circuit boards each including an inductance element and a capacitor element. FIG. 13 (A) shows a sectional side elevation of the laminate circuit board shown in FIG. 11, while FIG. 13 (B) shows a sectional side elevation of another laminate circuit board. More specifically, in the laminate circuit board 100 shown in FIG. 13 (A), the wiring layer 101 for connections and the wiring layers 102 to 103 for the inductance element are provided with a hole 114 extending therethrough to form an axial portion of the inductance element as vacant space. However, this hole 114 does not extend into the wiring layers 102 to 103. On the other hand, in the laminate circuit board 115 of the other type shown in FIG. 13 (B), a hole 116 extends through all the wiring layers, including, therefore, the wiring layers forming the capacitor element. If an inductance element having a large inductance value is required, the laminate circuit board may be designed to have the construction shown in FIG. 13 (B).

As described above, through application of the laminate capacitor and the laminate coil, the impedance-matching circuit and LC filter are constructed integrally within the laminate circuit board, whereby it is possible to realize a small-sized impedance-matching circuit and LC filter which permits adjustments of frequency and impedance to be effected easily and independently, on a surface thereof.

The first to eighth embodiments described above achieves the first object of the invention. Next, there will be described a ninth embodiment and a tenth embodiment which achieve the second object of the invention.

Figure 14:
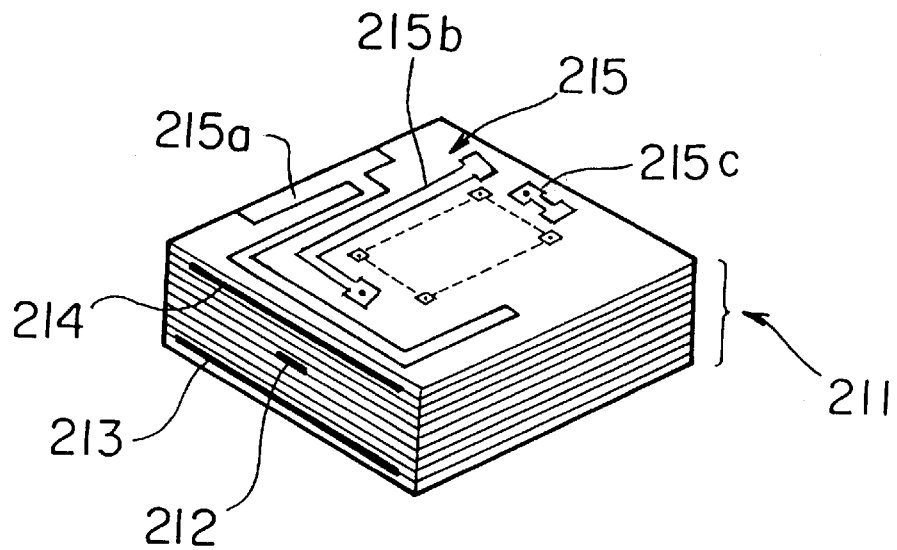
FIG. 14 (A), FIG. 14 (B) and FIG. 14 (C) are diagrams showing the construction of a high-frequency circuit board according to a ninth embodiment, in which FIG. 14 (A) is a perspective view of the high-frequency circuit board, FIG. 14 (B) is a plan view showing a ground pattern layer, and FIG. 14 (C) is a plan view showing a surface wiring pattern layer.
Figure 14:
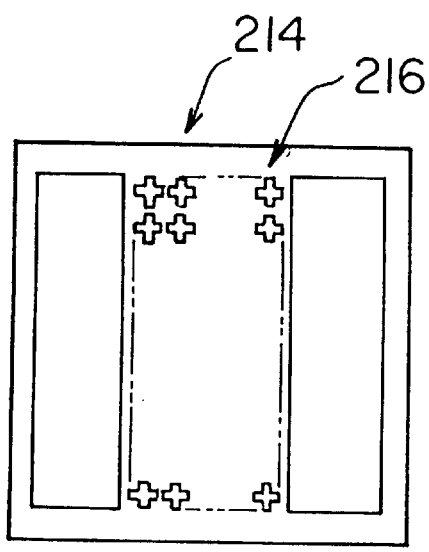
Figure 14:
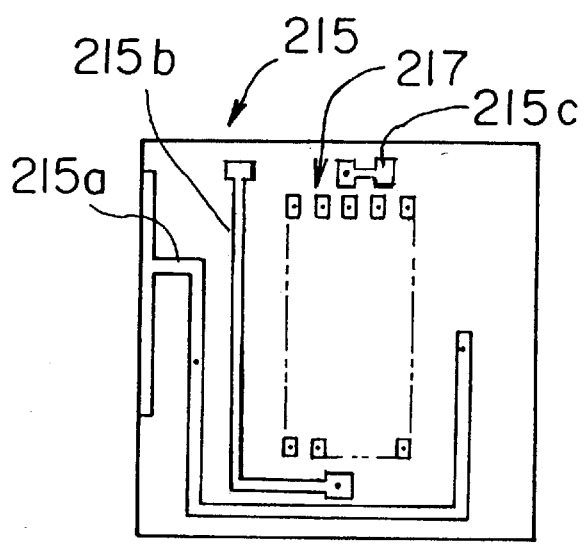

FIG. 14 (A), FIG. 14 (B), and FIG. 14 (C) show a high-frequency circuit board of a shielded laminate type according to the ninth embodiment of the invention. FIG. 14 (A) is a perspective view of the laminate circuit board, FIG. 14 (B) a plan view showing a ground pattern layer, and FIG. 14 (C) a plan view showing a surface layer formed with lands.

The high-frequency circuit board is formed by laminating a plurality of dielectric sheets 211 having a strip line 212, a wiring pattern 215, ground patterns (grounding conductors) 213 and 214, etc. properly formed on surfaces thereof, and then firing the resulting laminate. As shown in FIG. 14 (A), the strip line 212 is provided as a central conductor, and the ground patterns 213 and 214 are arranged on both sides of the strip line 212 with dielectric sheets being interposed between the ground patterns 213 and 214 and the strip line 212. Further, the surface wiring pattern 215 is provided with the dielectric sheet being interposed thereunder. The surface wiring pattern 215 is formed with a surface ground pattern 215a for grounding and signal patterns 215b and 215c. The strip line 212 has both ends thereof connected to the signal patterns 215b and 215c by way of vias, respectively.

The ground pattern 213 is formed of a plain flat foil, and connected to the surface ground pattern 215a by way of a via. The other ground pattern 214 includes, as shown in FIG. 14 (B), a mesh-like ground pattern, as part thereof, which is formed of a plurality of foil pieces 216 electrically separated from each other, substantially in the form of a mesh. The dielectric sheet arranged close to the ground pattern 214 has a surface formed with the surface wiring pattern 215. As shown in FIG. 14 (C), a plurality of lands 217 are formed in a manner corresponding to the plurality of foil pieces 216 of the ground pattern 214. The plurality of lands 217 are electrically connected to the corresponding foil pieces 216 by way of respective vias in one-to-one correspondence.

The lands 217 of the surface wiring pattern 215 are selectively connected to the surface ground pattern 215a of the surface wiring pattern 215 on the following grounds:

In a high-frequency circuit board of a shielded laminate type, assuming that the dielectric constant is represented by $\epsilon$, an area of the ground pattern by W, the thickness of a dielectric layer by d, and the permeability of same by $\mu$, the electrostatic capacity C as a distributed constant is expressed as $C=4\epsilon W/d$, and the impedance Z of the high-frequency circuit by $Z=\epsilon\mu/C$. Therefore, $$Z=\mu d/4W.$$

As is understood from this equation, the impedance Z is inversely proportional to the area W of the ground pattern, and hence if the area W of the ground pattern can be varied, it is possible to adjust the impedance of the high-frequency circuit.

Accordingly, the foil pieces 216 formed by dividing part of the ground pattern into portions electrically separated from each other are connected by way of the vias to the lands 217 of the surface wiring pattern 215, and the lands 217 are selectively connected to the surface ground pattern 215a for grounding.

As a result, by selecting the number of lands 217 connected to the surface ground pattern 215a, the area of the ground pattern 214 can be varied, which makes it possible to easily adjust the impedance of the high-frequency circuit.

Figure 15A:
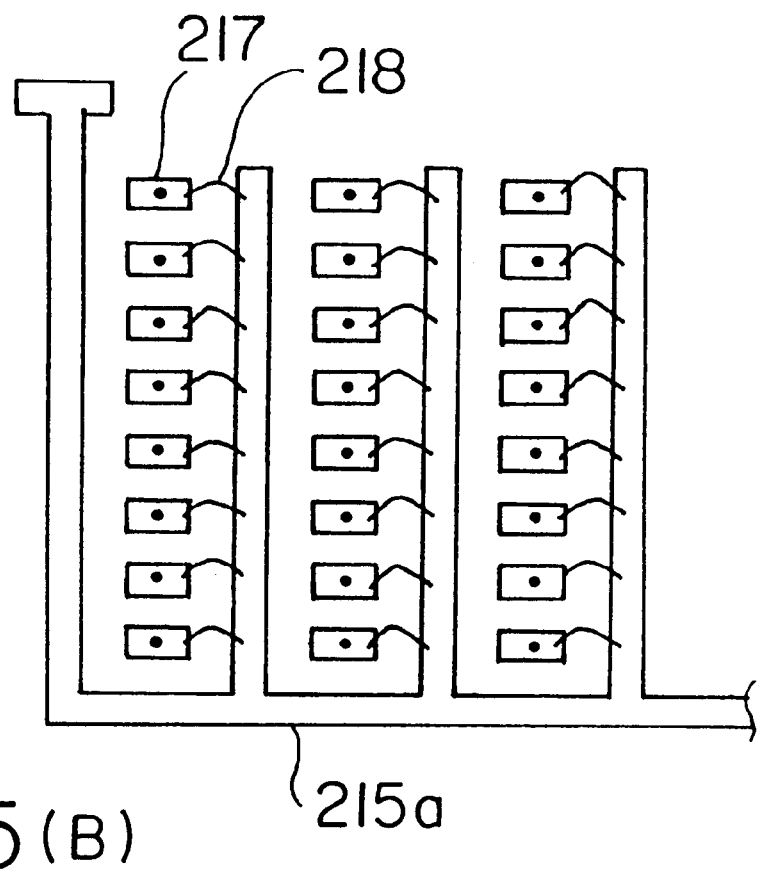
FIG. 15 (A) and FIG. 15 (B) are diagrams showing how connections are effected by wire bonding, in which FIG. 15 (A) is a plan view, and FIG. 15 (B) is a side view.
Figure 15B:
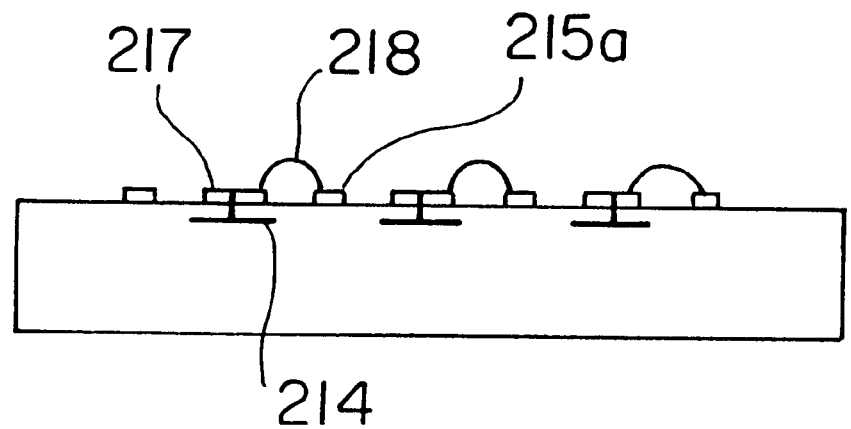

Electrical connections between lands 217 and the surface ground pattern 215a are effected, as shown in FIG. 15 (A) and FIG. 15 (B), by bonding (thermocompression bonding) of a wire 218 formed by a gold ribbon or the like between the lands 217 and the surface ground pattern 215a. In this connection, although the configuration of the surface ground pattern 215a shown in FIG. 15 is different from that shown in FIG. 14, this is because FIG. 14 shows an outline of the surface ground pattern 215a, while FIG. 15 shows details of same (this is also the case with FIG. 16 and FIG. 17).

Figure 16:
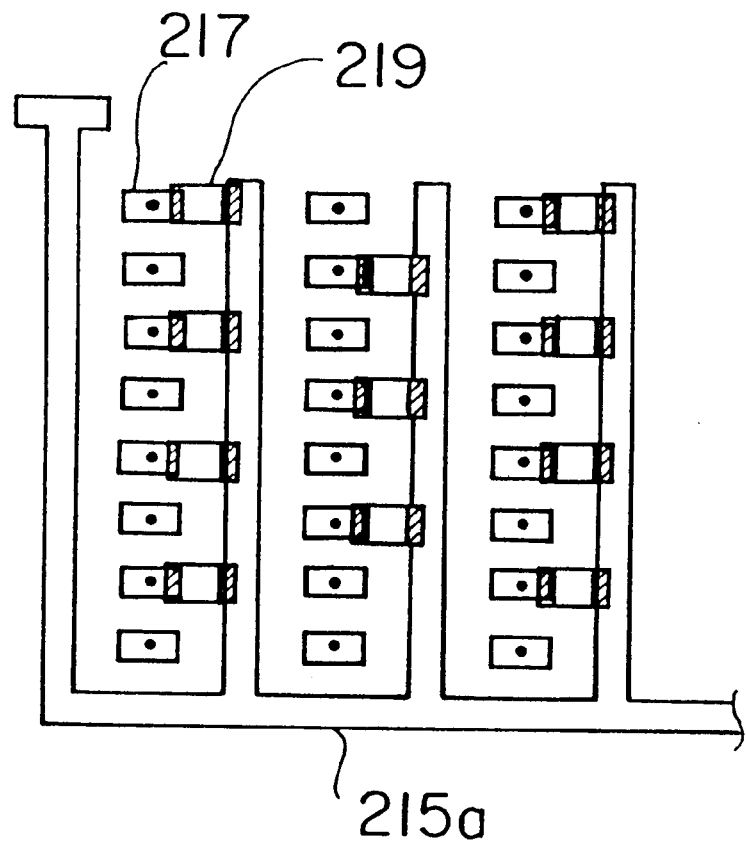
FIG. 16 (A) and FIG. 16 (B) are diagrams showing how connections are effected by jumper chips, in which FIG. 16 (A) is a plan view, and FIG. 16 (B) is a side view.
Figure 16:
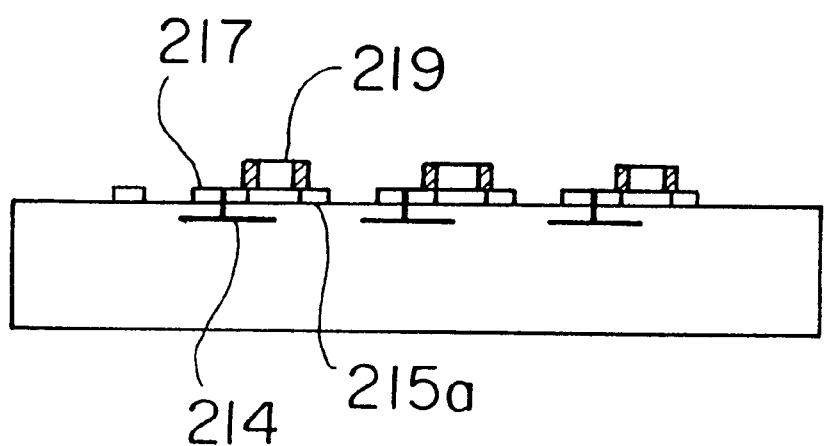

Further, the electrical connections between the lands 217 and the surface ground pattern 215a may be effected, as shown in FIG. 16(A) and FIG. 16 (B), by mounting jumper chips 219, as surface mount-type chip components intended for electrical connections, between the lands 217 and the surface ground pattern 215a, by the use of solder, an electrically-conductive adhesive, or the like.

Further, the electrical connections between the lands 217 and the surface ground pattern 215a may be effected by forming electrically-conductive material 220 between the lands 217 and the surface ground pattern 215a by screen printing or other film-forming techniques.

Figure 18:
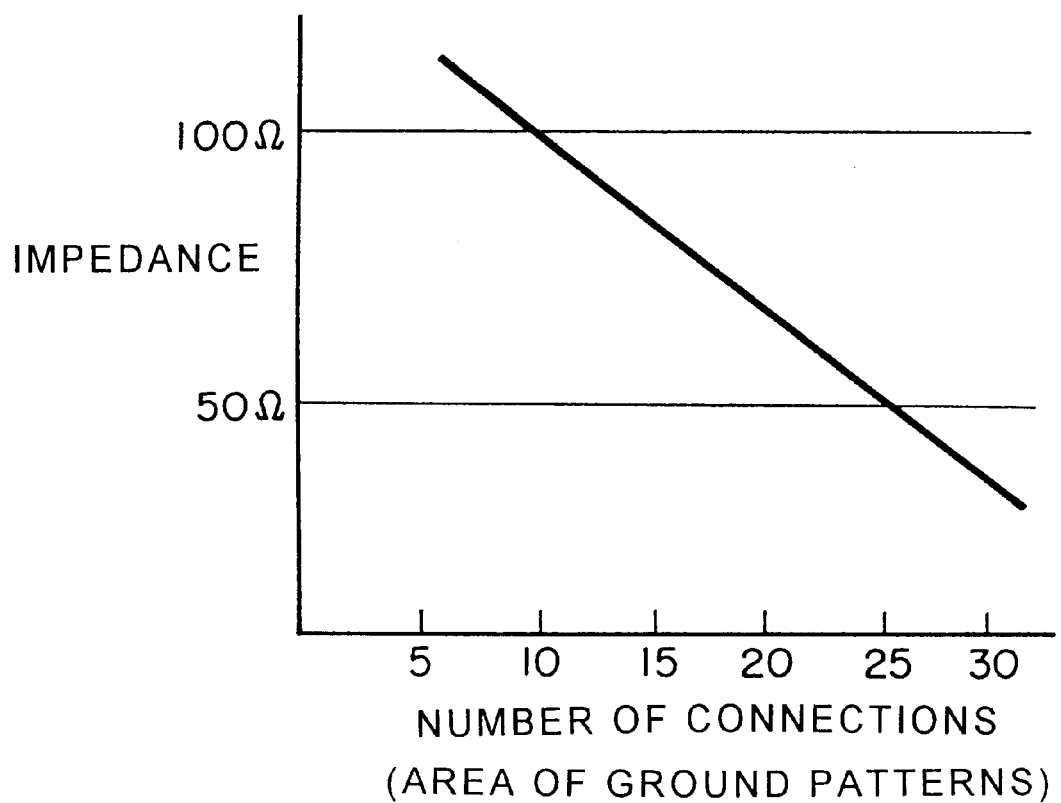
FIG. 18 is a graph showing the relationship between impedance and the number of connections (area of ground patterns)

FIG. 18 is a diagram showing the relationship between the number of connections effected between the lands 217 and the surface ground pattern 215a (which is proportional to the area of the ground pattern) and the impedance created thereby, which is held in the construction of the ninth embodiment. As is clear from the figure, the impedance is inversely proportional to the number of connections, and hence by properly selecting the number of connections effected, a desired value of impedance can be obtained.

Further, after the laminate circuit board is finished, the fine adjustment of impedance, if required, can be easily effected by increasing or decreasing the number of connections.

Figure 19:
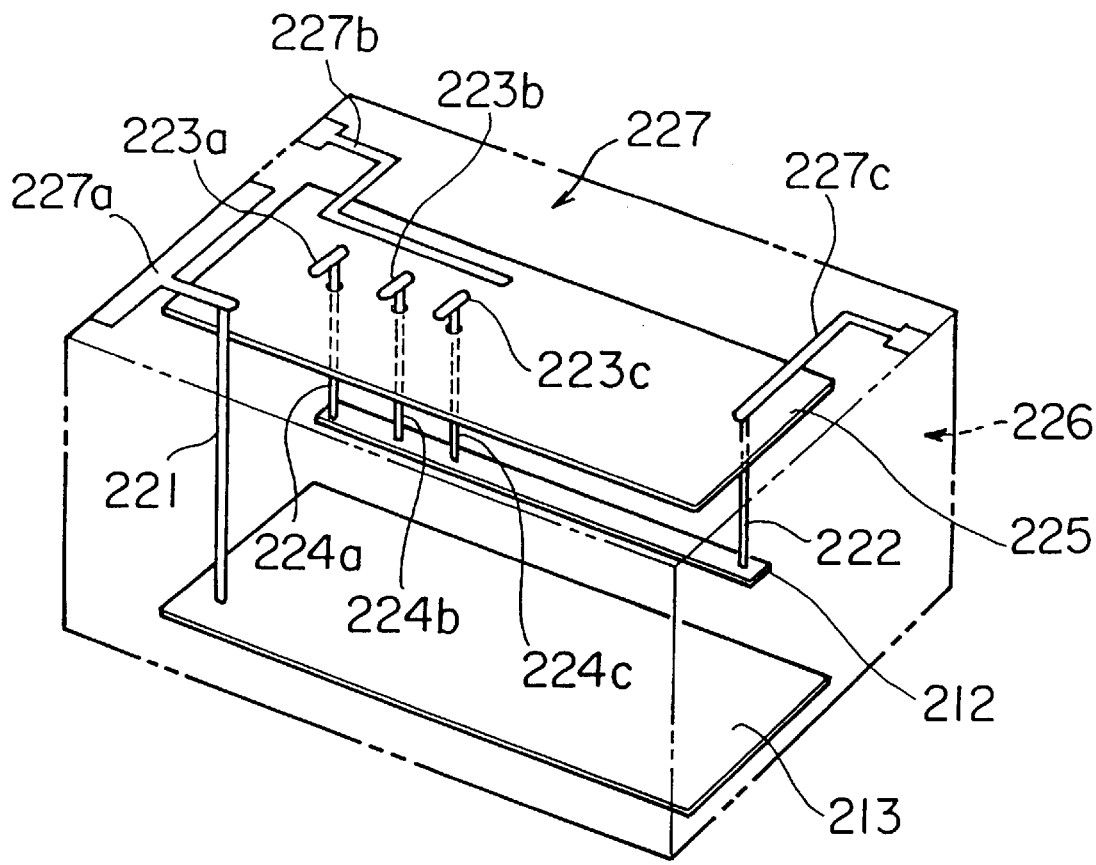
FIG. 19 (A) and FIG. 19 (B) are diagrams showing the construction of a high-frequency circuit board according to a tenth embodiment, in which FIG. 19 (A) is a perspective view, partly in a transparent form, and FIG. 19 (B) is a broken perspective view.
Figure 19:
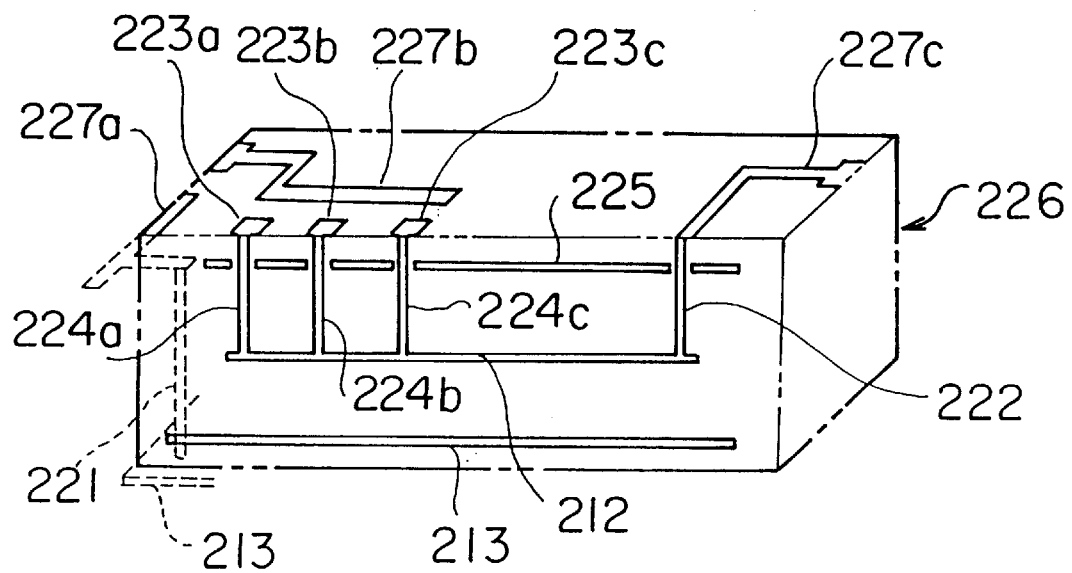

FIG. 19 (A) and FIG. 19 (B) show a high-frequency circuit board of a shielded laminate type according to a tenth embodiment of the invention. FIG. 19 (A) is a perspective view of the whole high-frequency circuit board, with part of dielectric being in a transparent form, while FIG. 19 (B) is a broken perspective view of same. In the figure, component parts and elements substantially identical to those of the ninth embodiment are designated by identical reference numerals.

The high-frequency circuit board is formed, similarly to the ninth embodiment described above, by laminating a plurality of dielectric sheets 226 having a strip line 212, a surface wiring pattern 227, ground patterns (grounding conductors) 213 and 225, etc. properly formed on surfaces thereof, and then firing the resulting laminate. As shown in FIG. 19 (A), the strip line 212 is provided as a central conductor, and the ground patterns 213 and 225 formed of plain flat foils are arranged on both sides of the strip line 212 with dielectric sheets interposed between the ground patterns 213 and 225 and the strip line 212. Further, a surface wiring pattern 227 is provided with a dielectric sheet interposed thereunder. The surface wiring pattern 227 includes a surface ground pattern 227a for grounding and signal patterns 227b and 227c.

The ground patterns 213 and 225 are electrically connected to the surface ground pattern 227a by way of a via 221. Although in this embodiment, this pair of the ground patterns 213 and 225 are each formed of a plain flat foil, the construction of the ninth embodiment may be applied to provide one of them as a ground pattern in the form of a mesh.

One end of the strip line 212 is electrically connected to the signal pattern 227c, by way of a via 222 insulated from the ground pattern 225. Then, in the vicinity of the other end of the strip line 212, the surface wiring pattern 227 extending along the strip line 212 is formed with a plurality of lands 223a to 223c spaced from each other. These lands 223a to 223c are connected by way of vias 224a to 224c to the strip line 212. The vias 224a to 224c are insulated from the ground pattern 225.

A selected one of the lands 223a to 223c is electrically connected to the signal pattern 227b.

Figure 17:
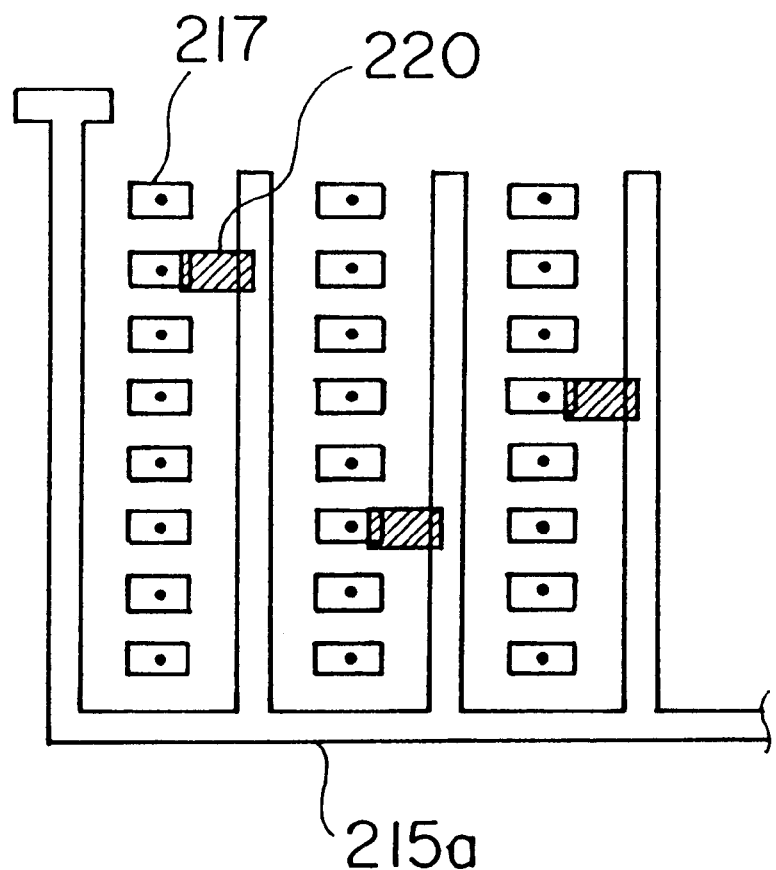
FIG. 17 (A) and FIG. 17 (B) are diagrams showing how connections are effected by printing, in which FIG. 17 (A) is a plan view, and FIG. 17 (B) is a side view.
Figure 17:
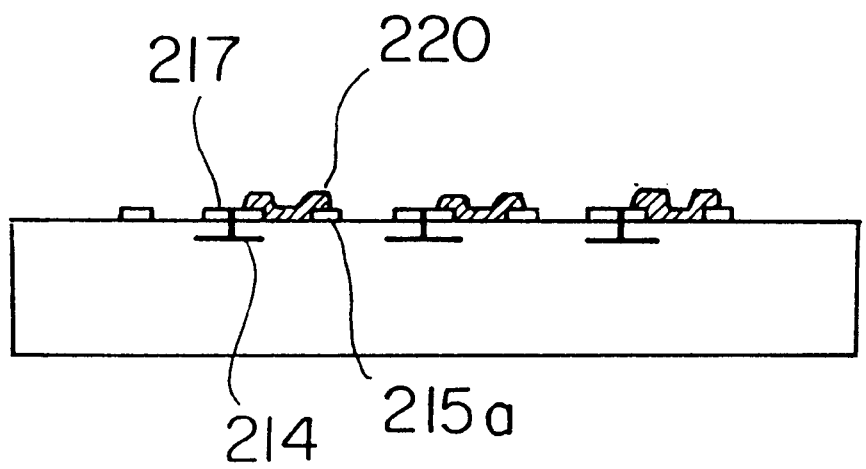

An electrical connection between one of these lands 223a to 223c and the signal pattern 227b can be effected by connecting means described in the ninth embodiment with reference to FIG. 15 to FIG. 17.

Figure 20:
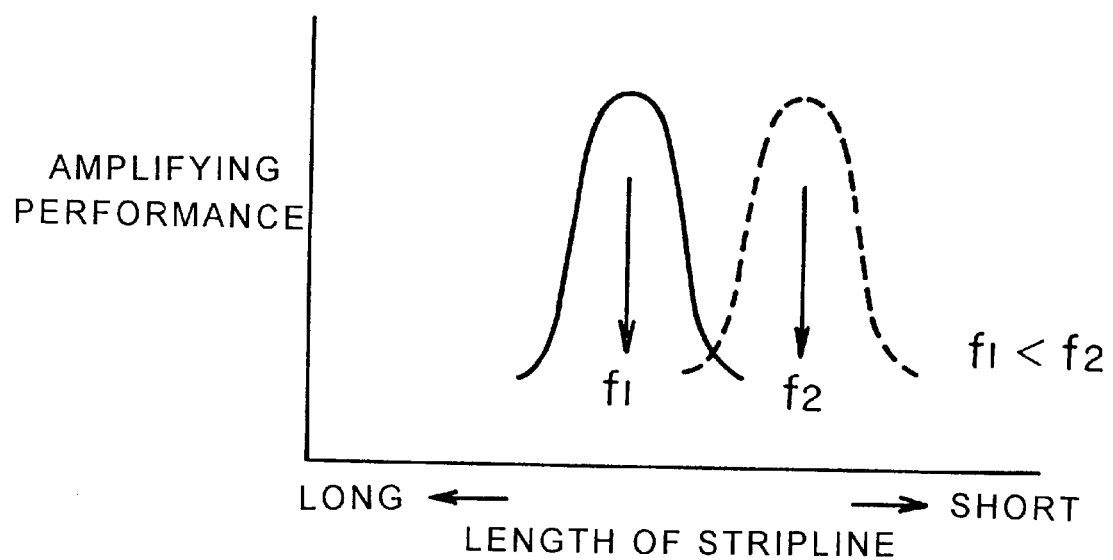
FIG. 20 is a graph showing the relationship between amplifying performance and frequencies exhibited by a high-frequency amplifier or the like, which varies with the length of a strip line.
Figure 21:
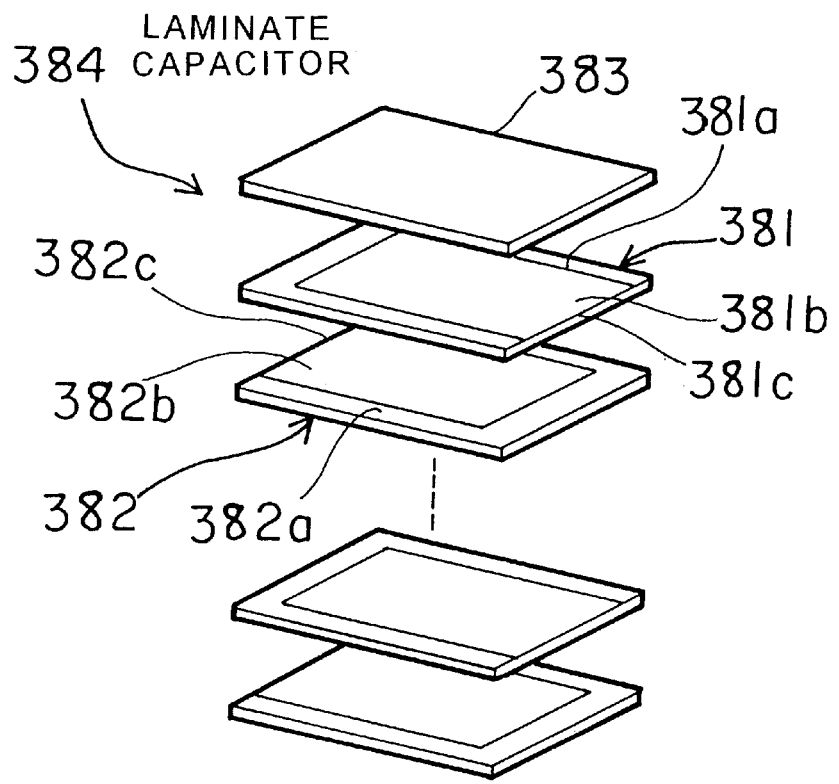
Figure 21:
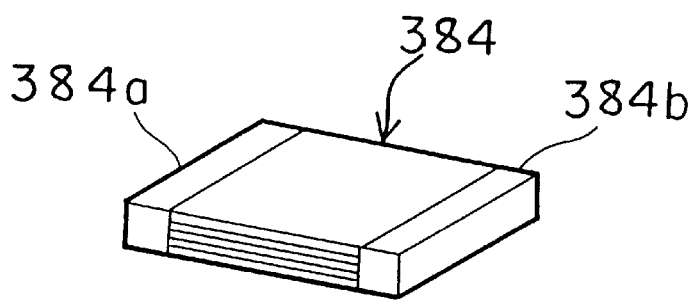
Figure 22:
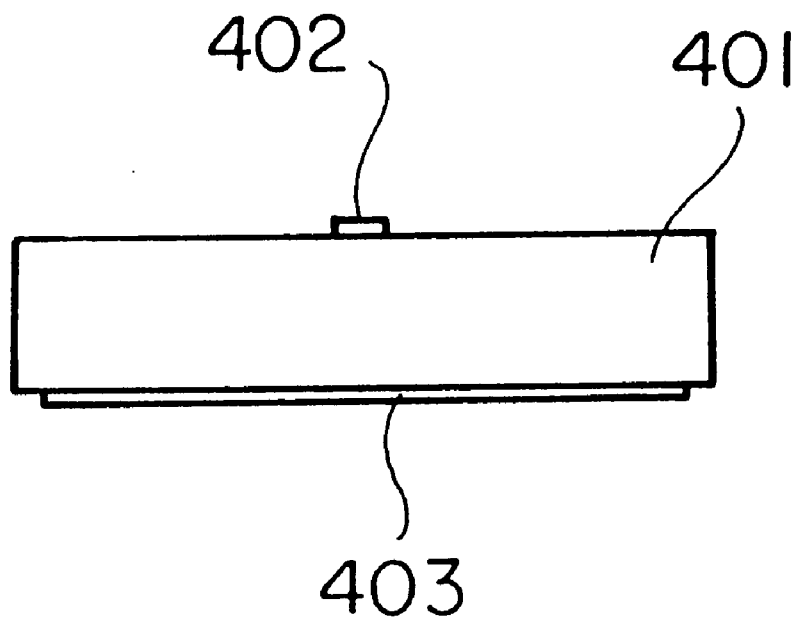
FIG. 22 is a side view showing a conventional high-frequency circuit board of a non-shielded type.
Figure 23:
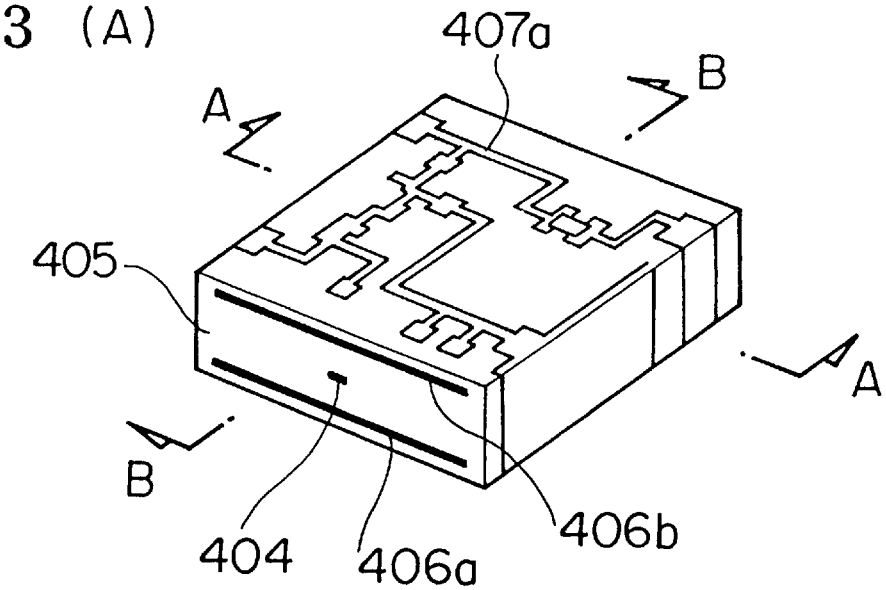
FIG. 23 (A), FIG. 23 (B), and FIG. 23 (C) are diagrams showing a conventional high-frequency circuit board of a shielded laminate type, in which FIG. 23 (A) is a perspective view, FIG. 23 (B) is a cross-sectional view taken on line A—A, and FIG. 23 (C) is a cross-sectional view taken on line B—B.
Figure 23:
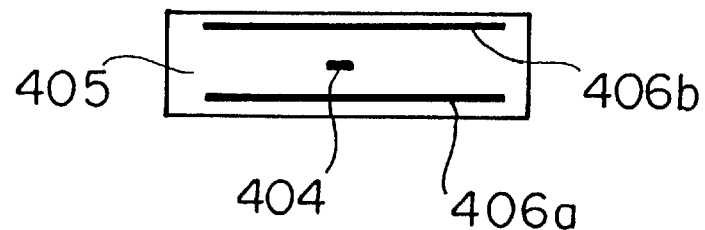
Figure 23:
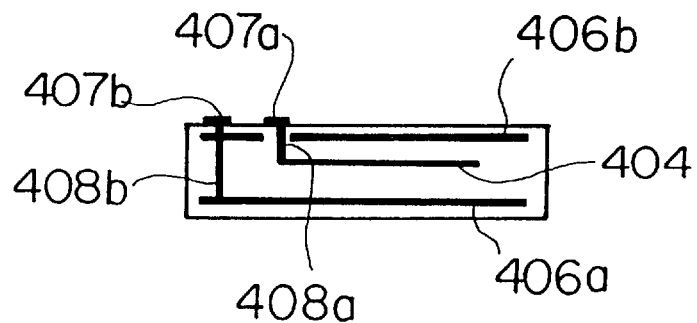

FIG. 20 shows the relationship between the amplifying performance and frequency dependent on the length of the strip line in a high-frequency amplifier or the like.

As shown in the figure, when the length of the strip line is smaller, matching can be effected at a higher frequency f2, and when it is larger, matching can be effected at a lower frequency f1.

Therefore, a signal phase and a delay time can be selected as desired by selectively effecting an electrical connection between the signal pattern 227b and one of a plurality of lands 223a to 223c, which makes it possible to construct the high-frequency circuit board which permits matching at a desired frequency.

Further, even after completion of the laminate circuit board, the fine adjustment of a matching frequency, if required, can be easily effected by changing a selected land.

As described heretofore, according to the tenth embodiment, there can be provided a high-frequency circuit board of a shielded laminate type, in which circuit characteristics, such as impedance and matching of frequency, can be easily adjusted.

We claim:

1. A laminate circuit board formed by laminating a plurality of wiring layers including dielectric layers and patterns formed thereon to form a single laminated structure, comprising:

a plurality of first wiring layers each having an insulation layer formed with at least a pattern of a conductive foil, said plurality of first wiring layers being laminated one upon another;

a second wiring layer used for connections to said plurality of first wiring layers laminated to a surface of one of said plurality of first wiring layers laminated one upon another;

a plurality of terminal patterns formed on said second wiring layer in a state insulated from one another;

a plurality of vias for connecting at least two of said plurality of terminal patterns to corresponding patterns formed on said plurality of first wiring layers; and connecting means for selectively connecting said plurality of terminal patterns to each other in a plurality of combinations after said single laminated structure is formed, thereby providing a plurality of available circuit configurations in said single laminated structure depending on how said connecting means connects said plurality of terminal patterns to each other;

wherein said plurality of first wiring layers are used as wiring layers for electrodes of a laminate-type capacitor;

wherein said plurality of available circuit configurations provide a plurality of corresponding capacitance values; and wherein said wiring layers for electrodes are formed by a plurality of independent electrode wiring layers, and a plurality of common electrode wiring layers, said independent wiring layers and said common electrode wiring layers being laminated in an alternating manner with a dielectric interposed therebetween, said plurality of independent wiring layers being connected to corresponding ones of said plurality of terminal patterns by way of said vias, said common electrode wiring layers being electrically connected to each other to be connected to one of said plurality of terminal patterns.

2. A method of making a laminate circuit board consisting of a plurality of wiring layers including dielectric layers and patterns formed thereon to form a single laminated structure, comprising the steps of:

laminating a plurality of first wiring layers one upon another, each said layer having an insulation layer formed with at least a pattern of a conductive foil;

laminating a second wiring layer used for connections to said plurality of first wiring layers to a surface of one of said plurality of first wiring layers;

forming a plurality of terminal patterns on said second wiring layer in a state insulated from one another;

forming a plurality of vias for connecting at least two of said plurality of terminal patterns to corresponding patterns on said plurality of first wiring layers; and selectively connecting said plurality of terminal patterns to one another in a plurality of combinations after said single laminated structure is formed, thereby providing a plurality of available circuit configurations in said single laminated structure depending on how said plurality of terminal patterns are connected to one another.

3. A method of making a laminate circuit board according to claim 2, wherein said plurality of first wiring layers are used as wiring layers for electrodes of a laminate-type capacitor, and wherein said plurality of available circuit configurations provide a plurality of corresponding capacitance values.

4. A method of making a laminate circuit board according to claim 2, wherein said wiring layers for electrodes are formed by a plurality of independent electrode wiring layers, and a plurality of common electrode wiring layers, said independent wiring layers and said common electrode wiring layers being laminated in an alternating manner with a dielectric interposed therebetween, said plurality of independent wiring layers being connected to corresponding ones of said plurality of terminal patterns by way of said vias, said common electrode wiring layers being electrically connected to one another to be connected to one of said plurality of terminal patterns.

5. A laminate circuit board consisting of a plurality of wiring layers including dielectric layers and patterns formed therein to form a single laminated structure, the laminate circuit board being prepared by a process comprising the steps of:

laminating a plurality of first wiring layers one upon another, each said layer having an insulation layer formed with at least a pattern of a conductive foil;

laminating a second wiring layer used for connections to said plurality of first wiring layers to a surface of one of said plurality of first wiring layers;

forming a plurality of terminal patterns on said second wiring layer in a state insulated from one another;

forming a plurality of vias for connecting at least two of said plurality of terminal patterns to corresponding patterns on said plurality of first wiring layers; and selectively connecting said plurality of terminal patterns to one another in a plurality of combinations after said single laminated structure is formed, thereby providing a plurality of available circuit configurations in said single laminated structure depending on how said plurality of terminal patterns are connected to one another.

* * * * *